(12) United States Patent
Bao et al.

(10) Patent No.: US 12,433,020 B2
(45) Date of Patent: Sep. 30, 2025

(54) MULTI-VT SOLUTION FOR REPLACEMENT METAL GATE BONDED STACKED FET

(71) Applicant: International Business Machines Corporation, Armonk, NY (US)

(72) Inventors: Ruqiang Bao, Niskayuna, NY (US); Dechao Guo, Niskayuna, NY (US); Junli Wang, Slingerlands, NY (US); Heng Wu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 505 days.

(21) Appl. No.: 17/945,422

(22) Filed: Sep. 15, 2022

(65) Prior Publication Data

US 2024/0096887 A1    Mar. 21, 2024

(51) Int. Cl.
*H10D 84/85* (2025.01)
*H01L 21/02* (2006.01)
(Continued)

(52) U.S. Cl.
CPC ..... *H10D 84/856* (2025.01); *H01L 21/02532* (2013.01); *H01L 21/02603* (2013.01);
(Continued)

(58) Field of Classification Search
CPC ...... H10D 84/856; H10D 87/00; H10D 88/00; H10D 84/0186; H10D 84/017; H10D 64/017; H10D 30/014; H10D 30/43; H10D 30/6735; H10D 84/0167; H10D 30/6757; H10D 84/0193; H10D 84/83; H10D 84/85;
(Continued)

(56) References Cited

U.S. PATENT DOCUMENTS 7,485,508 B2 *   2/2009   Dyer ...................... H10D 86/01
                                                             438/459
9,859,166 B1      1/2018   Cheng et al.
(Continued)

FOREIGN PATENT DOCUMENTS

TW            201519325 A      5/2015

OTHER PUBLICATIONS

H. Arimura et al., "Dipole-First Gate Stack as a Scalable and Thermal Budget Flexible Multi-Vt Solution for Nanosheet/CFET Devices," 2021 IEEE International Electron Devices Meeting (IEDM), 2021, pp. 13.5.1-13.5.4, doi: 10.1109/IEDM19574.2021.9720527.

(Continued)

*Primary Examiner* — Sonya McCall-Shepard
(74) *Attorney, Agent, or Firm* — Matthew Zehrer

(57) ABSTRACT

A semiconductor device includes a substrate; a set of first transistors positioned on an upper surface of the substrate, each of the set of first transistors comprising a first gate and a first dielectric; an insulating layer positioned on an upper surface of the set of first transistors; and a set of second transistors positioned over the set of first transistors and with the set of first transistors on an upper surface of the insulating layer, each of the set of second transistors having a second gate and a second dielectric; wherein each of the first dielectrics is connected to a sidewall of each of a corresponding first gate; and wherein each of the second dielectrics is connected to the insulating layer.

19 Claims, 40 Drawing Sheets

(51) Int. Cl.
*H01L 21/321* (2006.01)
*H01L 23/528* (2006.01)
*H10D 30/01* (2025.01)
*H10D 30/43* (2025.01)
*H10D 30/67* (2025.01)
*H10D 30/69* (2025.01)
*H10D 62/10* (2025.01)
*H10D 64/01* (2025.01)
*H10D 84/01* (2025.01)
*H10D 84/03* (2025.01)
*H10D 84/83* (2025.01)
*H10D 88/00* (2025.01)

(52) U.S. Cl.
CPC ...... *H01L 21/3212* (2013.01); *H01L 23/5286* (2013.01); *H10D 30/014* (2025.01); *H10D 30/0415* (2025.01); *H10D 30/43* (2025.01); *H10D 30/6729* (2025.01); *H10D 30/6735* (2025.01); *H10D 30/701* (2025.01); *H10D 62/121* (2025.01); *H10D 64/01* (2025.01); *H10D 64/017* (2025.01); *H10D 84/0167* (2025.01); *H10D 84/0181* (2025.01); *H10D 84/0186* (2025.01); *H10D 84/038* (2025.01); *H10D 88/01* (2025.01)

(58) Field of Classification Search
CPC .............. H10D 84/853; H01L 23/5286; H01L 23/5226; H01L 21/76897; H01L 21/76898
See application file for complete search history.

(56) References Cited

U.S. PATENT DOCUMENTS

| | | | |
|---|---|---|---|
| 10,008,583 B1 | 6/2018 | Rodder et al. | |
| 10,205,018 B1* | 2/2019 | Li | H10D 84/0177 |
| 10,700,064 B1 | 6/2020 | Zhang et al. | |
| 11,152,396 B2 | 10/2021 | Lilak | |
| 11,171,136 B2* | 11/2021 | Kim | H10D 84/85 |
| 11,222,964 B2 | 1/2022 | Gardner et al. | |
| 11,349,004 B2* | 5/2022 | Yu | H10D 84/038 |
| 2009/0079000 A1* | 3/2009 | Yamazaki | H10D 86/425 |
| | | | 257/351 |
| 2015/0123202 A1 | 5/2015 | Lin et al. | |
| 2016/0035722 A1 | 2/2016 | Or-Bach et al. | |
| 2020/0013681 A1 | 1/2020 | Lee et al. | |
| 2020/0091288 A1 | 3/2020 | Lee et al. | |
| 2020/0126987 A1* | 4/2020 | Rubin | H10D 84/0186 |
| 2021/0202481 A1 | 7/2021 | Fulford et al. | |
| 2021/0408282 A1 | 12/2021 | Tiwari et al. | |
| 2022/0293759 A1* | 9/2022 | Chou | H10D 64/017 |
| 2023/0197830 A1* | 6/2023 | Chan | H10D 84/0135 |
| | | | 438/199 |
| 2024/0006415 A1* | 1/2024 | Sharma | H10D 30/6729 |

OTHER PUBLICATIONS

J. Zhang et al., "High-k metal gate fundamental learning and multi-Vt options for stacked nanosheet gate-all-around transistor," 2017 IEEE International Electron Devices Meeting (IEDM), 2017, pp. 22.1.1-22.1.4, doi: 10.1109/IEDM.2017.8268438.

R. Bao et al., "Extendable and Manufacturable Volume-less Multi-Vt Solution for 7nm Technology Node and Beyond," 2018 IEEE International Electron Devices Meeting (IEDM), 2018, pp. 28.5.1-28.5.4, doi: 10.1109/IEDM.2018.8614518.

W.-T. Chang, M.-H. Li, C.-H. Hsu, W.-C. Lin and W.-K. Yeh, "Modifying Threshold Voltages to n- and p-Type FinFETs by Work Function Metal Stacks," in IEEE Open Journal of Nanotechnology, vol. 2, pp. 72-77, 2021, doi: 10.1109/OJNANO.2021.3109897.

* cited by examiner

MULTI-VT SOLUTION FOR REPLACEMENT METAL GATE BONDED STACKED FET

BACKGROUND

The exemplary embodiments described herein relate generally to semiconductor devices and methods for the fabrication thereof and, more specifically, to devices and methods in which multiple threshold voltages are used in stacked transistor devices.

Semiconductor packages generally employ a variety of integrated circuit (IC) devices, typically circuit elements such as transistors that are mounted on silicon crystal substrates or wafer material. In the manufacture of a semiconductor package incorporating transistors, fabrication processes include depositions of material to form films, masking and patterning, material etching and removal, and doping treatments. In carrying out these fabrication processes on micro-levels, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are encountering greater challenges as scaling enters single digit nanometer semiconductor device fabrication nodes and as the 2D areas increase in size. In order to compensate for scaling down to nanoscale level and to limit 2D increases in area, three-dimensional (3D) semiconductor circuits in which transistors are stacked on top of each other have been proposed.

The stacking of transistors is based on a new device architecture anticipated to be applicable to future logic technology. However, uncertainties abound when considering the specific configurations for this new device architecture, particularly with regard to gate stacking, replacement metal gates, and transistors and other devices in which multiple threshold voltages are used. In such configurations, several variables should be considered, namely, variables that account for the thermal aspects of the transistors or devices as they pertain to degradation of the materials, abilities to provide for multiple voltages in a single device, and abilities to share gates in a structure.

BRIEF SUMMARY

In one exemplary aspect, a semiconductor device comprises: a substrate; a set of first transistors positioned on an upper surface of the substrate, each of the set of first transistors comprising a first gate and a first dielectric; an insulating layer positioned on an upper surface of the set of first transistors; and a set of second transistors positioned over the set of first transistors and with the set of first transistors on an upper surface of the insulating layer, each of the set of second transistors having a second gate and a second dielectric. Each of the first dielectrics is connected to a sidewall of each of a corresponding first gate. Each of the second dielectrics is connected to the insulating layer.

At least one of the transistors of the set of first transistors may comprise a dipole element and at least one of the transistors of the set of first transistors may comprise a non-dipole element. At least one transistor of the set of second transistors may be positioned over at least one transistor of the set of first transistors in a stacked configuration and may define a multiple threshold voltage arrangement. The semiconductor device may further comprise a self-aligned gate connection between at least one of the transistors of the set of first transistors and at least one of the transistors of the second set of transistors. The semiconductor device may further comprise a back-end-of-line layer on an upper surface of the set of second transistors. The semiconductor device may further comprise a backside power distribution network on a lower surface of the substrate.

In another exemplary aspect, a method for forming a semiconductor device comprises: forming layers of silicon structure to form a first channel and a second channel on a substrate; processing the first channel to form a dipole element and the second channel to form a non-dipole element; depositing a first high-k dielectric layer around the first channel and the second channel and depositing a first interlayer dielectric on the first high-k dielectric layer; forming a bottom dummy gate around the dipole element and around the non-dipole element; bonding an insulation layer to the bottom dummy gate and a layer of silicon on the insulation layer; forming a first transistor element in the layer of silicon over the dipole element and a second transistor element in the layer of silicon over the non-dipole element; depositing a second high-k dielectric layer around the first transistor element and the second transistor element and depositing a second interlayer dielectric on the second high-k dielectric layer; forming an upper dummy gate around the first transistor element and the second transistor element; removing the first dummy gate to form a first void; filling the first void with a first metal to form a first replacement gate; removing the second dummy gate to form a second void; filling the second void with a second metal to form a second replacement gate; forming a first set of contacts to the first replacement gate and forming a second set of contacts to the second replacement gate; forming a back-end-of-line layer on the second set of contacts; and forming a backside power distribution network on the first set of contacts.

Forming layers of silicon structure to form a first channel and a second channel on a substrate may comprise depositing alternating layers of Si and SiGe and removing the SiGe. Forming the first transistor element and the second transistor element may comprise forming finned FET devices in the layer of silicon. Forming one of the first transistor element and the second transistor element may comprise forming a second dipole element. Removing the first dummy gate may comprise forming openings from the second interlayer dielectric to the first dummy gate and depositing spacers on one or more sidewalls of the openings. The method may further comprise pulling material of the first dummy gate through the formed openings. Filling the first void with the first metal to form the first replacement gate may comprise connecting the first metal to the insulation layer. The method may further comprise self-aligning the first replacement gate to the second replacement gate. The method may further comprise carrying out a chemical mechanical polish to planarize the contacts with the second interlayer dielectric.

In another exemplary aspect, a method for forming a semiconductor device comprises: forming a first transistor structure and a second transistor structure on a substrate; patterning the first transistor structure as a dipole element and configuring the second transistor structure as a non-dipole element; forming a first dummy gate over the dipole element and the non-dipole element; depositing an insulator layer on the first dummy gate; forming a third transistor structure over the dipole element and a fourth transistor structure over the non-dipole element; forming a second dummy gate over the third transistor structure and the fourth transistor structure; replacing the first dummy gate with a first replacement gate; replacing the second dummy gate with a second replacement gate to form a multiple threshold voltage formation between at least the first transistor structure and the third transistor structure; depositing an MOL interlayer dielectric layer over the second replacement gate; forming a first set of contacts from the MOL interlayer dielectric layer to one or more of the first replacement gate and the second replacement gate; forming a second set of contacts from the substrate to the first replacement gate; forming back-end-of-line layer on the first set of contacts; and forming a backside power distribution network on the second set of contacts.

Forming a third transistor structure and forming the fourth transistor structure may comprise forming a dipole element and a non-dipole element. The method may further comprise forming a first high-k dielectric layer and a first interlayer dielectric around the first dummy gate and forming a second high-k dielectric layer and a second interlayer dielectric around the second dummy gate. The method may further comprise forming a carrier wafer on the back-end-of-line layer.

In another exemplary aspect, a method for forming a semiconductor device comprises: forming a first transistor structure and a second transistor structure on a substrate; patterning the first transistor structure to form a dipole element and configuring the second transistor structure as a non-dipole element; forming a first dummy gate over the dipole element and the non-dipole element; depositing an insulator layer on the first dummy gate; forming a third transistor structure over the dipole element and a fourth transistor structure over the non-dipole element; forming a second dummy gate over the third transistor structure and the fourth transistor structure; replacing the first dummy gate with a first replacement gate; replacing the second dummy gate with a second replacement gate to form a multiple threshold voltage formation between at least the first transistor structure and the third transistor structure; depositing an MOL interlayer dielectric layer over the second replacement gate; forming a first set of contacts to one or more of the first replacement gate and the second replacement gate; forming a second set of contacts to the first replacement gate; forming back-end-of-line layer on the first set of contacts; and forming a backside power distribution network on the second set of contacts.

The first set of contacts may be formed from the MOL interlayer dielectric layer to one or more of the first replacement or the second replacement gate, and the second set of contacts may be formed from the substrate to the first replacement gate. Both the first set of contacts and the second set of contacts may be formed through the MOL interlayer dielectric layer. The first replacement gate and the second replacement gate may be self-aligned.

In another exemplary aspect, a method comprises: forming a first FET comprising a dipole element on a substrate; forming a second FET comprising a non-dipole element on a substrate; depositing a bottom dummy gate and a first dielectric layer around the dipole element and around the non-dipole element; bonding an insulating layer to the bottom dummy gate and a layer of silicon on the insulating layer; forming a third FET in the layer of silicon over the dipole element and a fourth FET in the layer of silicon over the non-dipole element; depositing an upper dummy gate and a second dielectric layer around the third FET and the fourth FET; replacing the first dummy gate with a first metal gate; replacing the second dummy gate with a second metal gate; forming a first set of contacts to the first metal gate and forming a second set of contacts to the second metal gate; forming a back-end-of-line layer on the second set of contacts; and forming a backside power distribution network on the first set of contact. The first dielectric layer is connected to a sidewall of the first metal gate. The second dielectric layer is connected to the insulating layer.

The first metal gate and the second metal gate may be self-aligned.

Advantages of the structures and methods described above generally involve thermal budgeting aspects. In particular, degradation of the gate stack is minimized due to the 3D aspect of the overall semiconductor package. Furthermore, the semiconductor package has the ability to provide multiple threshold voltages (e.g., metal gate patterning and dipole patterning) in a unitary structure, thus increasing overall efficiency. Moreover, the embodiments described herein illustrate the ability to provide both shared gates and independent gates in a single structure.

BRIEF DESCRIPTION OF THE SEVERAL
VIEWS OF THE DRAWINGS

The foregoing and other aspects of exemplary embodiments are made more evident in the following Detailed Description, when read in conjunction with the attached Drawing Figures, wherein:

FIGS. 1A, 1B, and 1C are schematic side views of a multi-Vt semiconductor device in which FETs are stacked;

FIG. 2A is a schematic top view of elements of a bottom layer of the semiconductor device;

FIGS. 2B, 2C, and 2D are schematic side views of the bottom layer of FIG. 2A;

FIG. 3A is a schematic top view of the bottom layer of FIG. 2A showing non-dipole and dipole elements;

FIGS. 3B, 3C, and 3D are schematic side views of the bottom layer of FIG. 3A;

FIGS. 4A, 4B, and 4C are schematic side views of the bottom layer of FIG. 3A showing a dummy gate and an ILD;

FIGS. 5A, 5B, and 5C are schematic side views of the bottom layer showing a bonding oxide layer and a silicon layer thereon forming a top layer;

FIGS. 6A, 6B, and 6C are schematic side views of the silicon layer with fins formed therein;

FIGS. 7A, 7B, and 7C are schematic side views of the fins showing an ILD and a high-k dielectric layer in the top layer;

FIGS. 8A, 8B, and 8C are schematic side views of the top layer showing openings to the bottom layer and spacers in the openings;

Figure 17A:
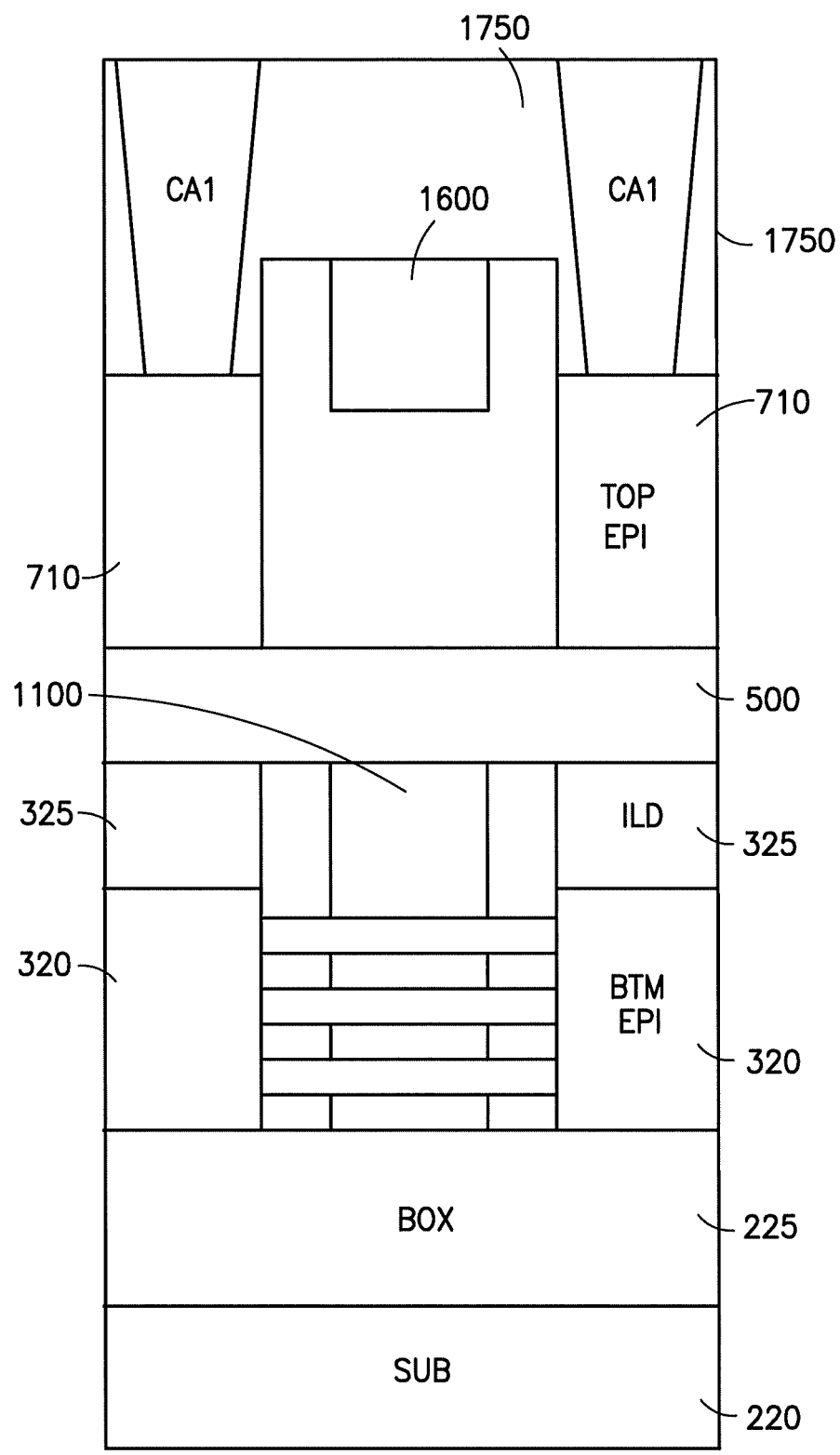
Figure 17B:
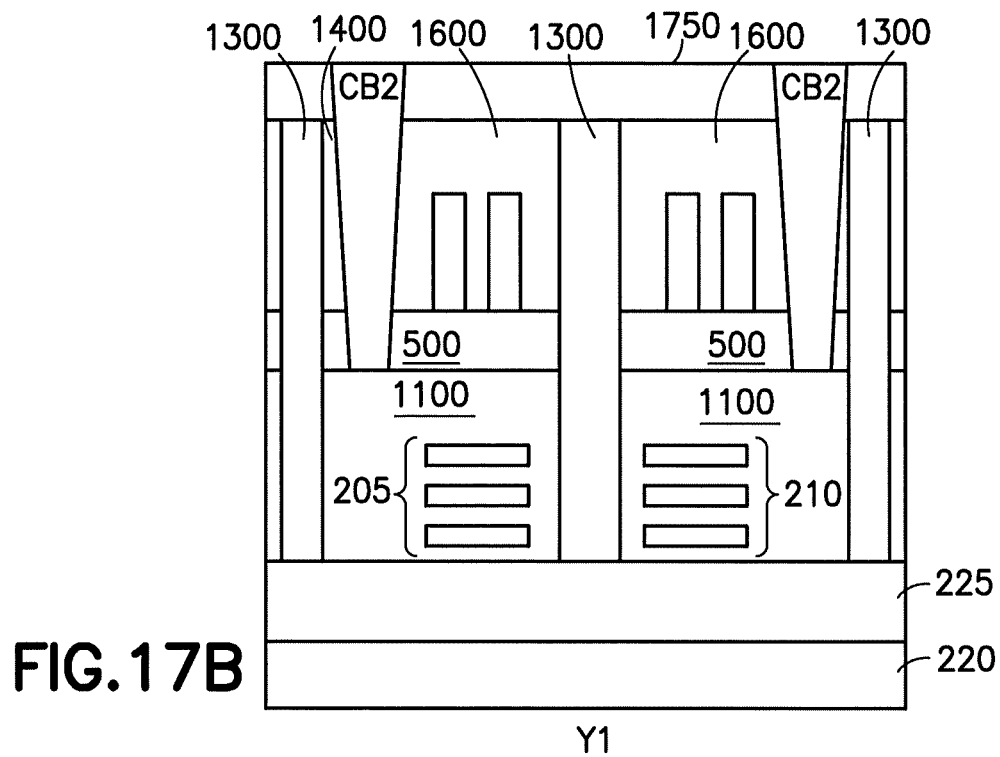
Figure 17C:
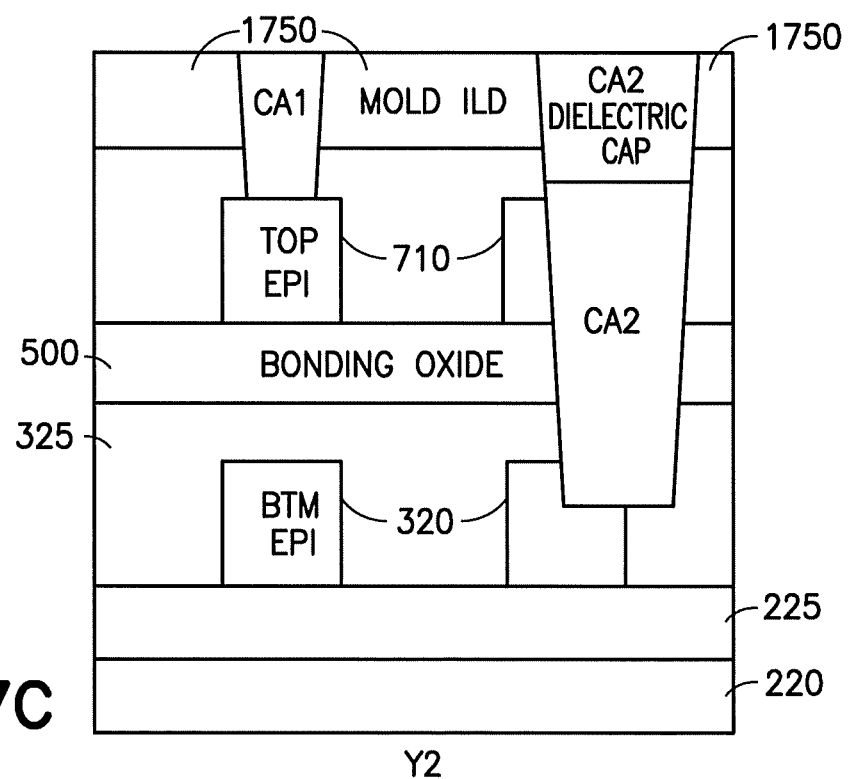
Figure 18A:
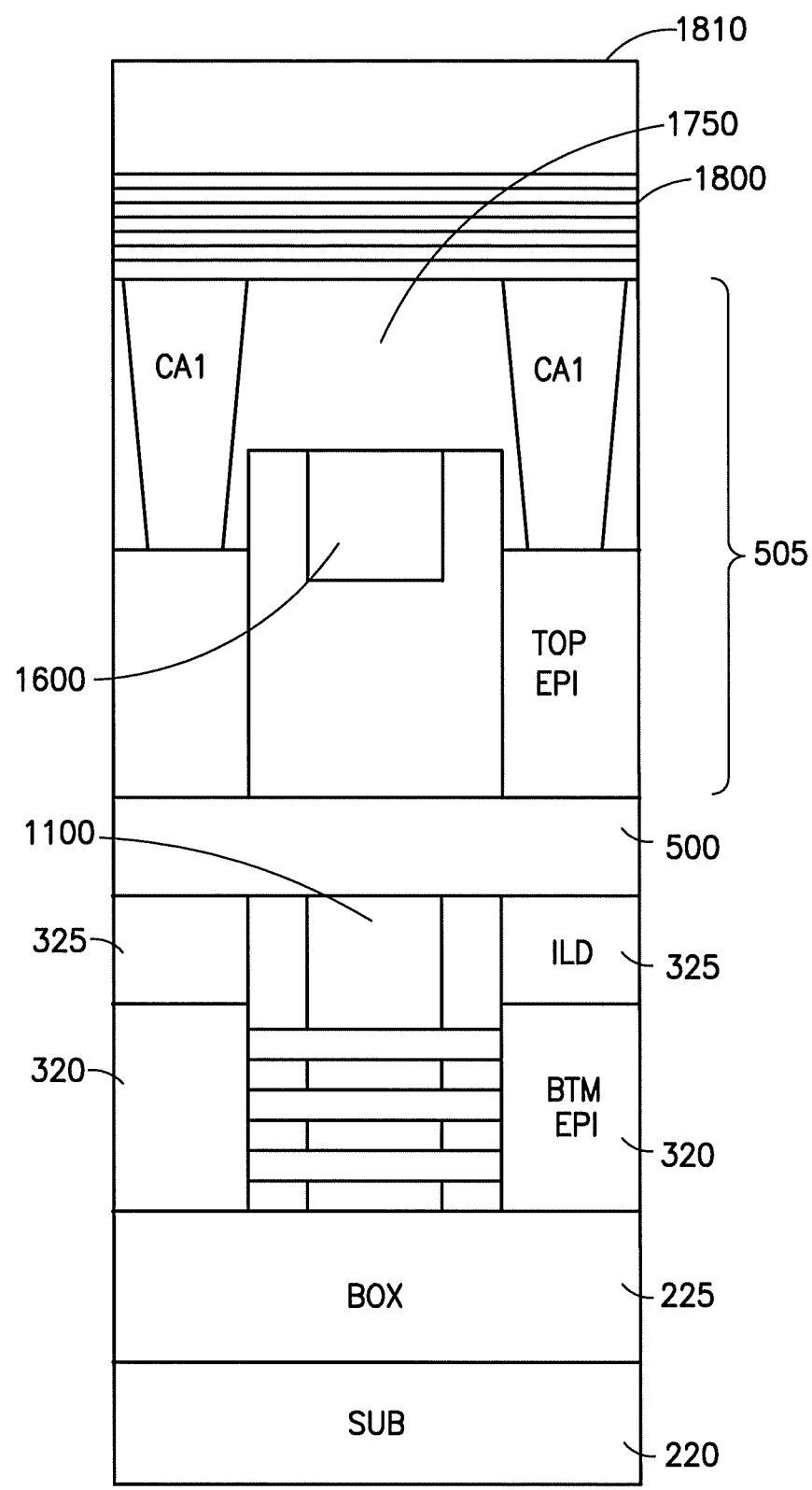
Figure 18B:
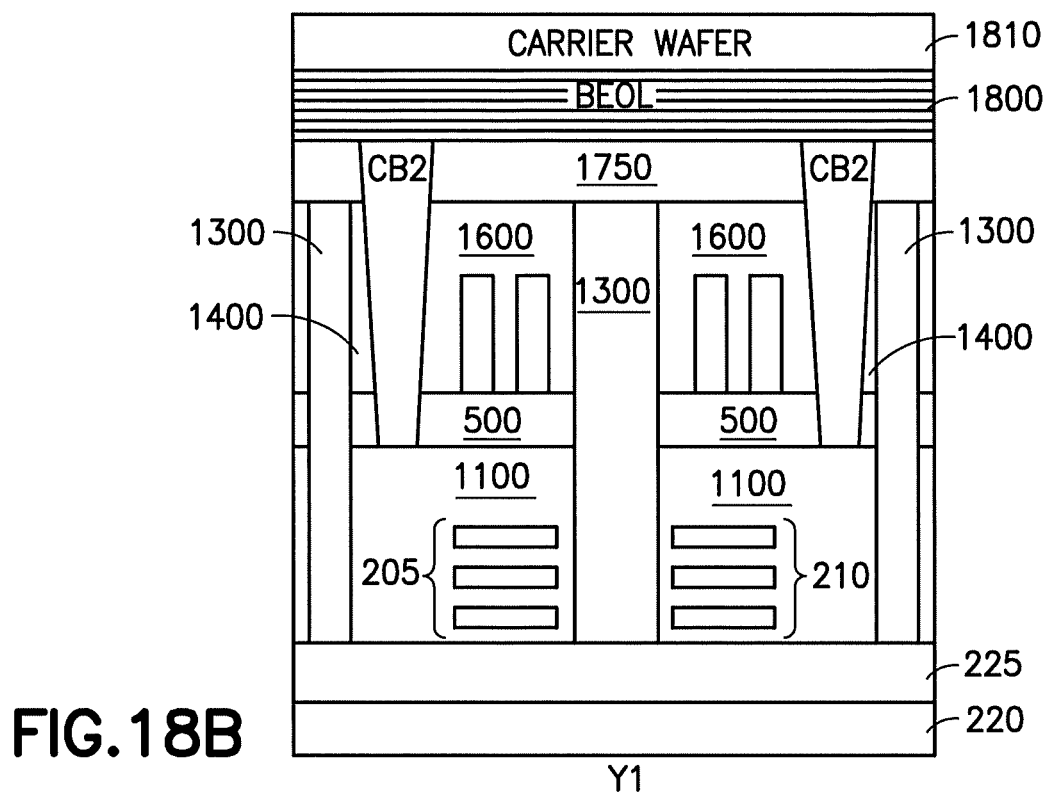
Figure 18C:
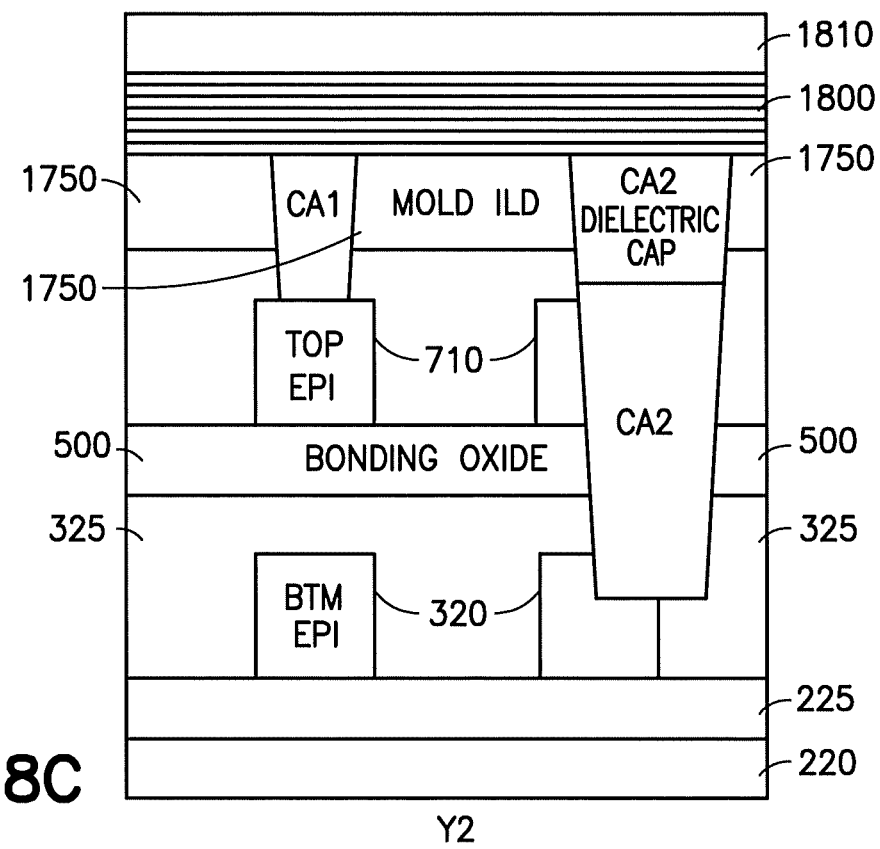
Figure 19A:
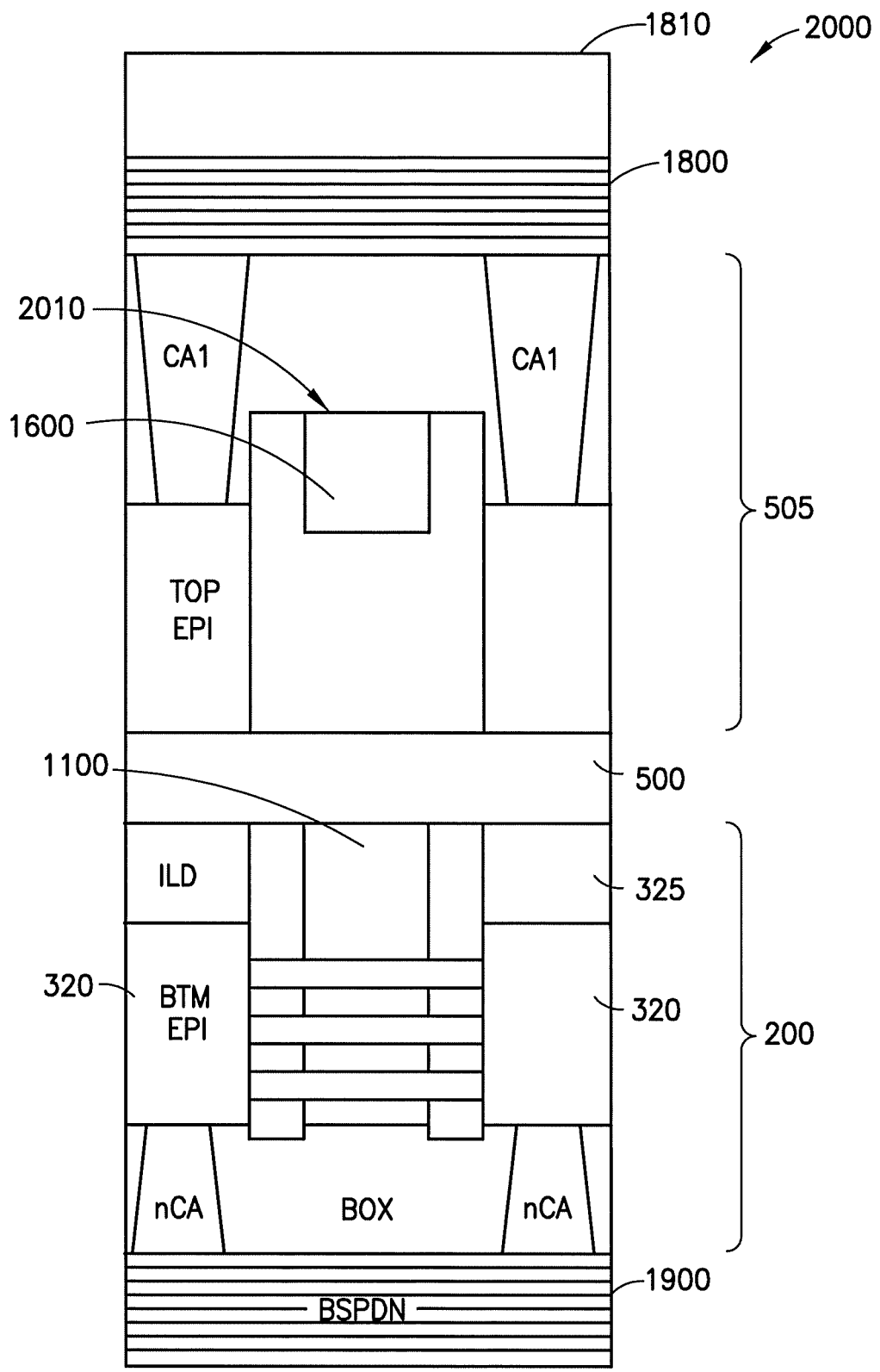
Figure 19C:
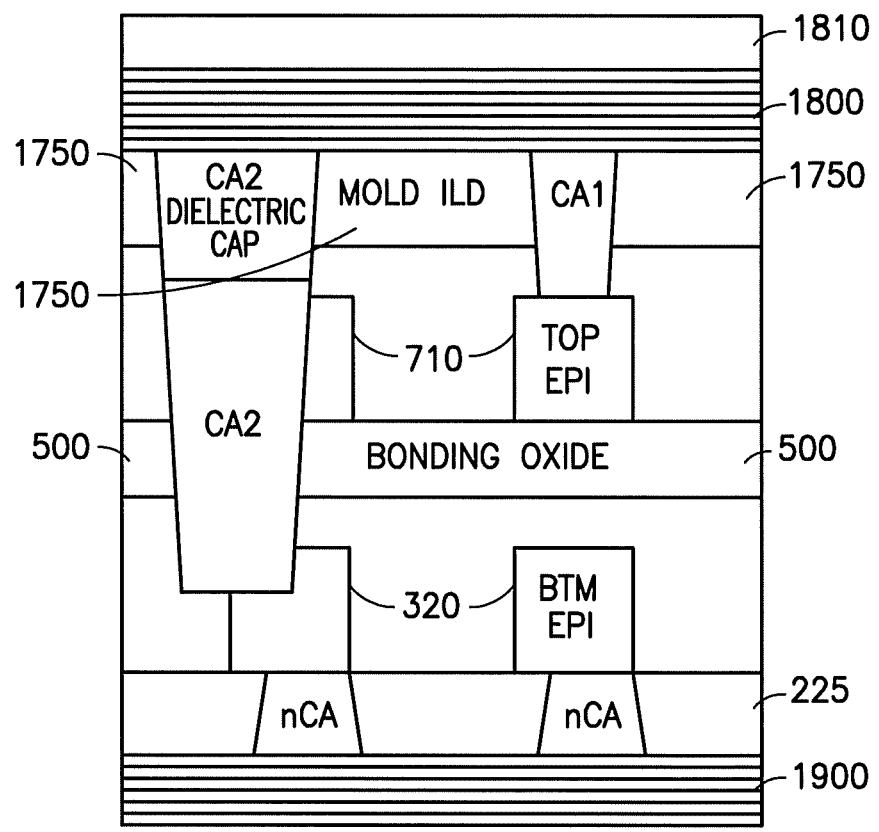
Figure 19B:
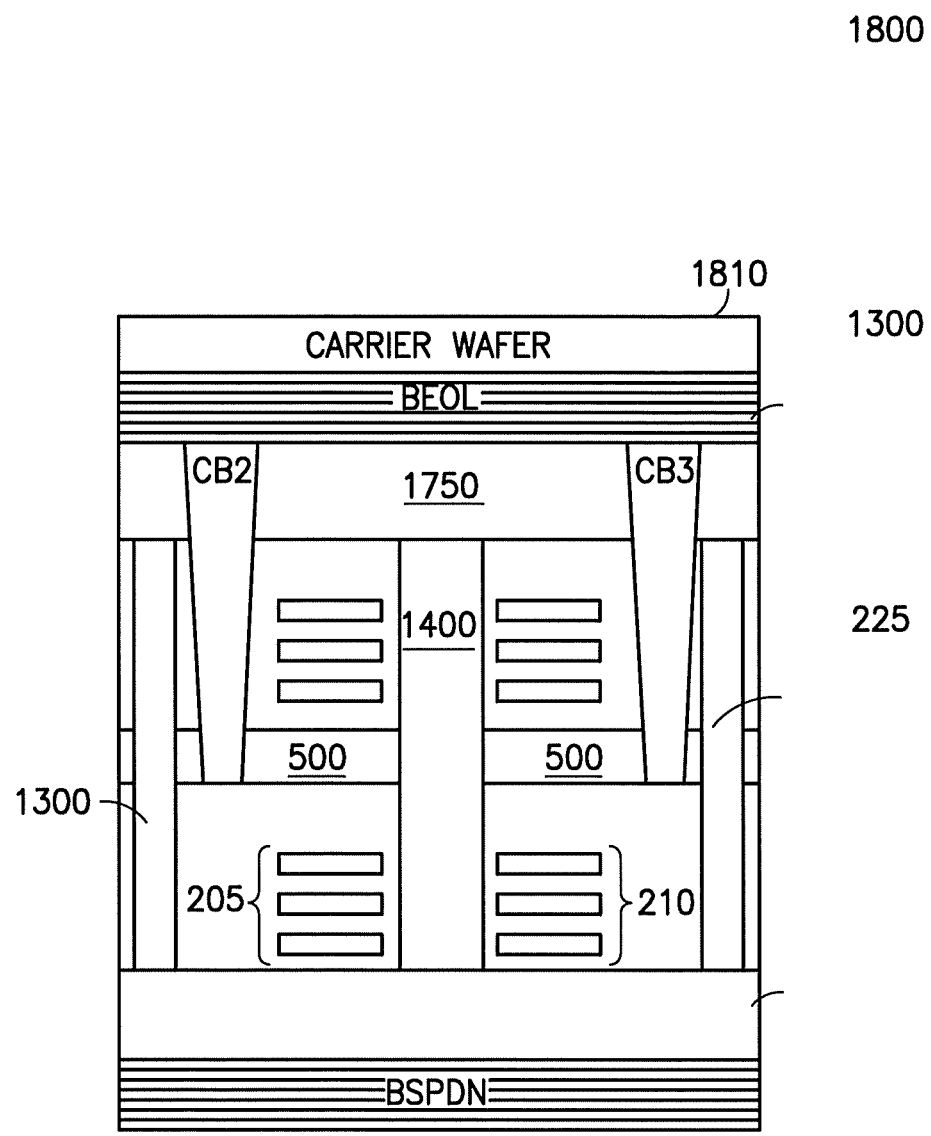
Figure 20A:
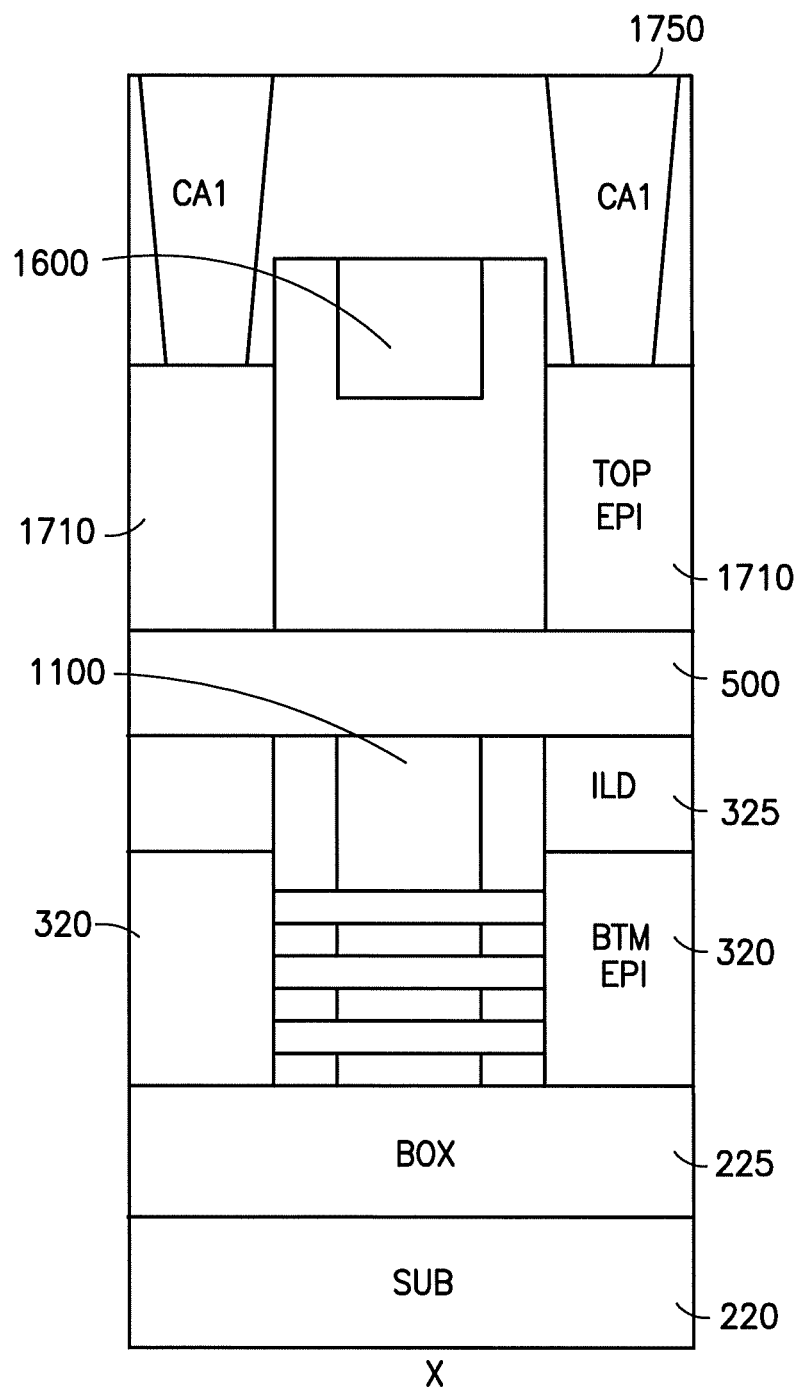
Figure 20B:
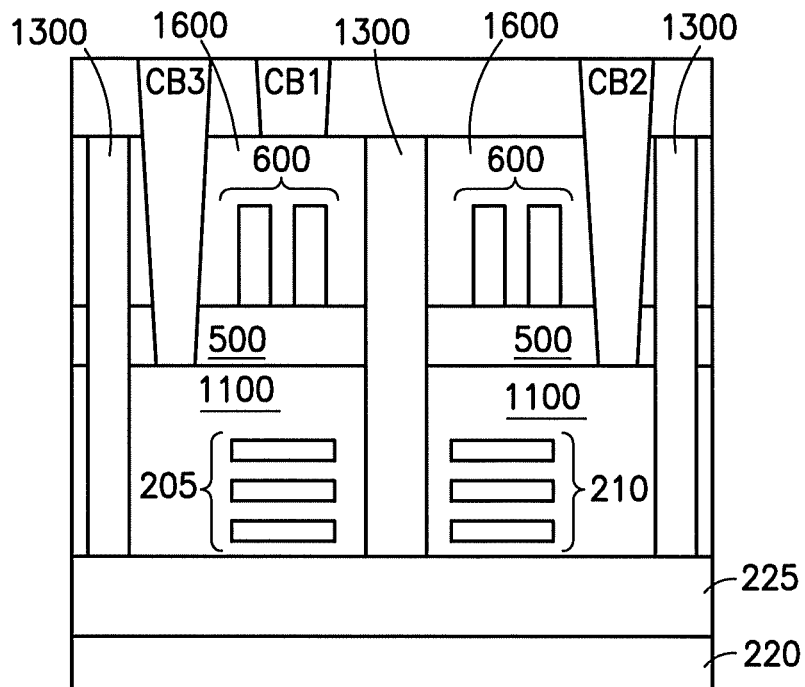
Figure 20C:
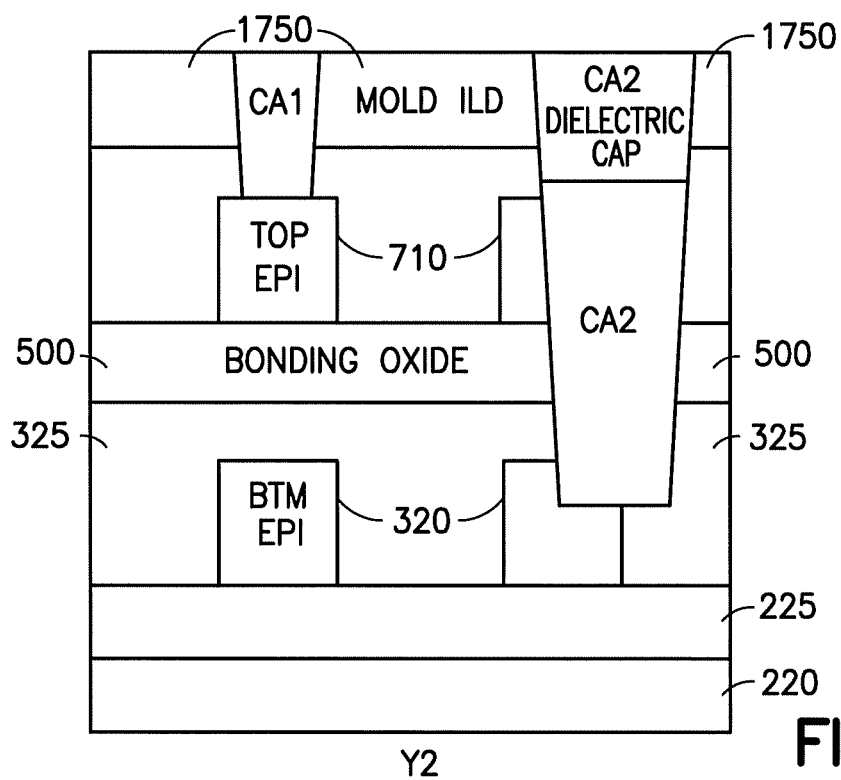
Figure 21A:
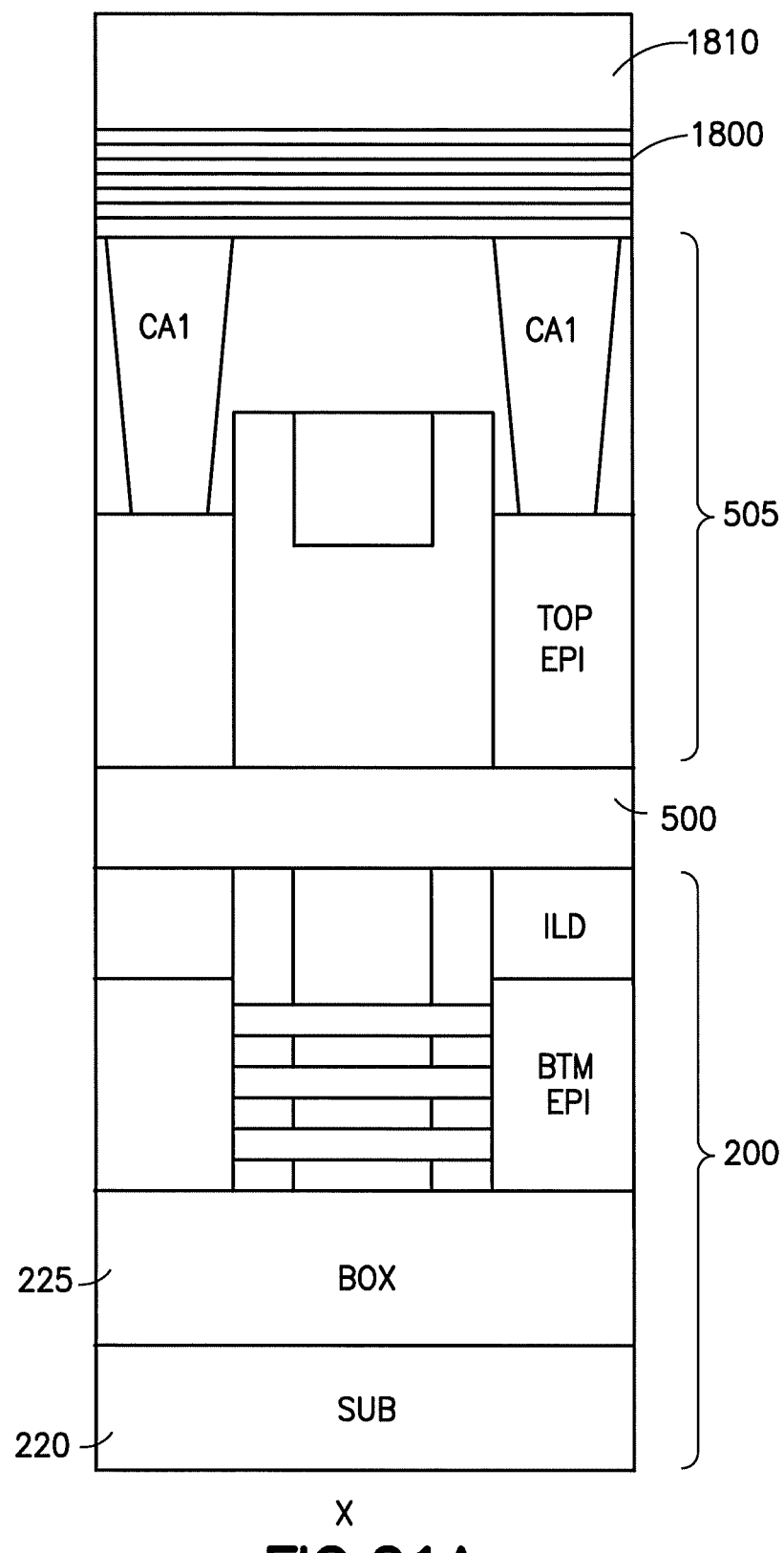
Figure 21B:
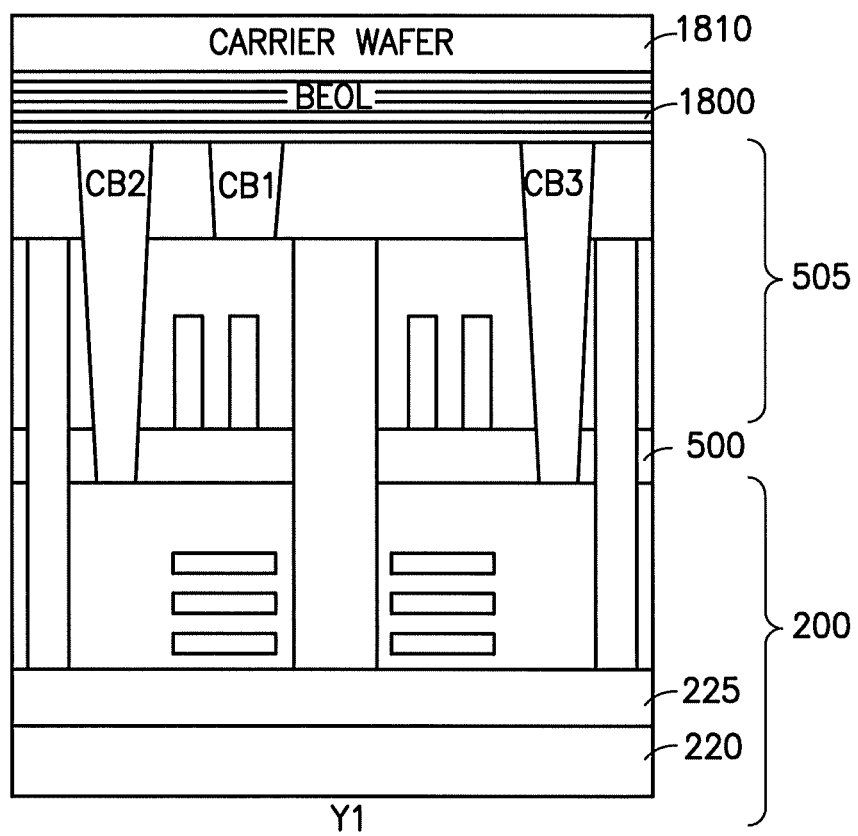
Figure 21C:
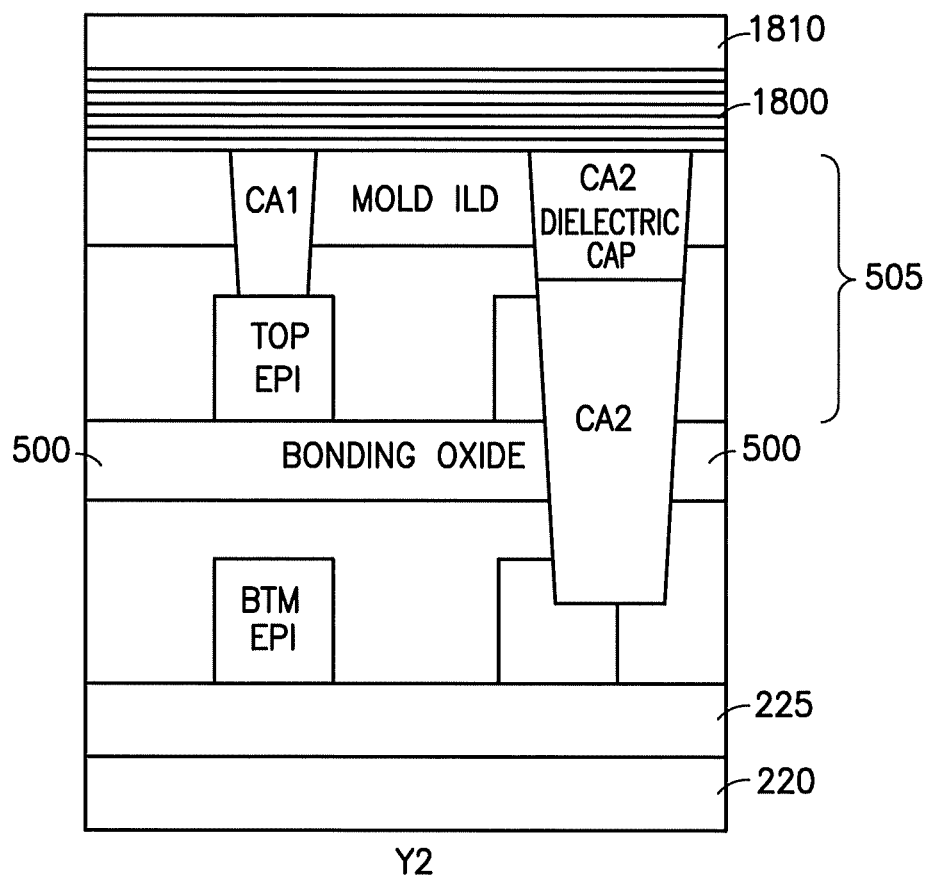
Figure 22A:
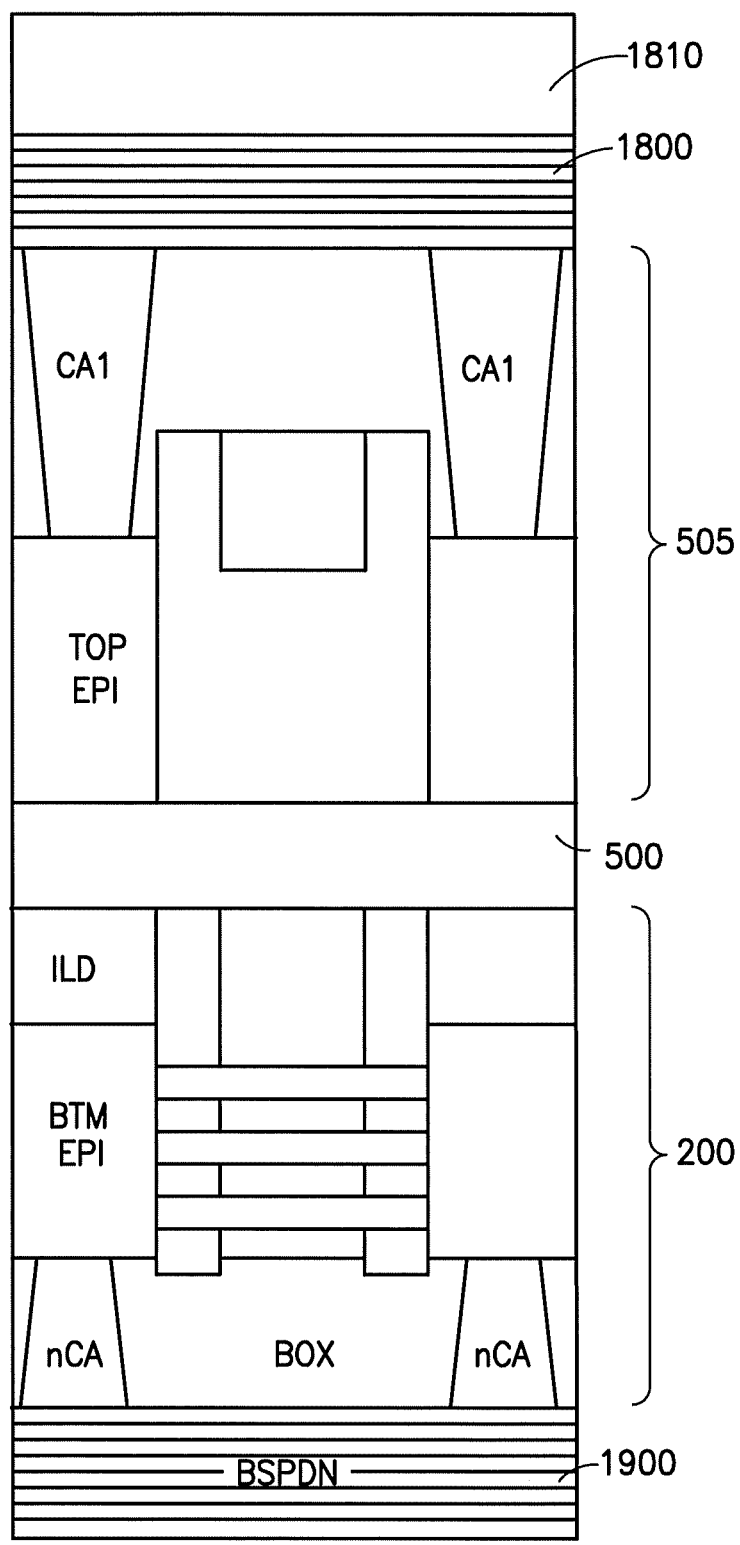
Figure 22B:
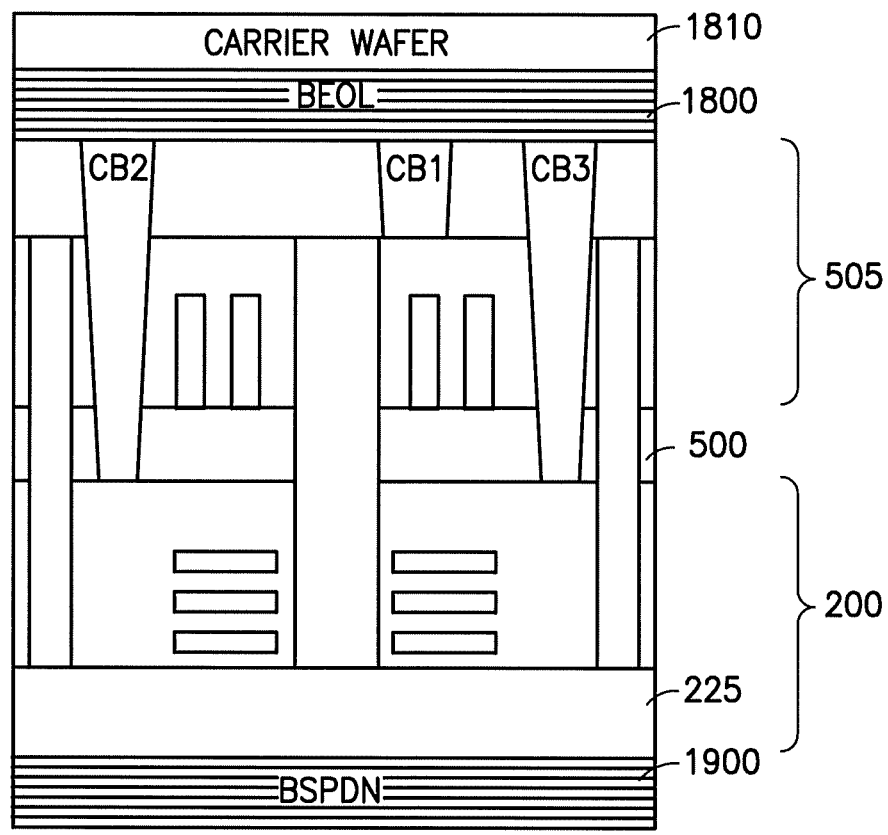
Figure 22C:
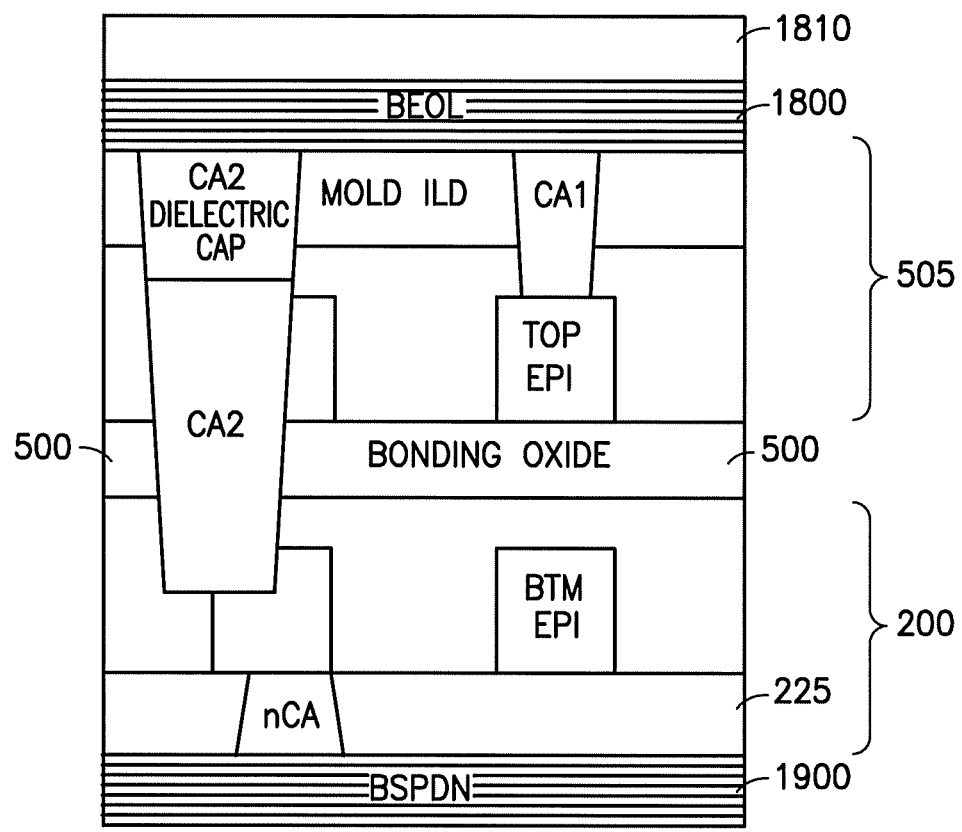
Figure 23:
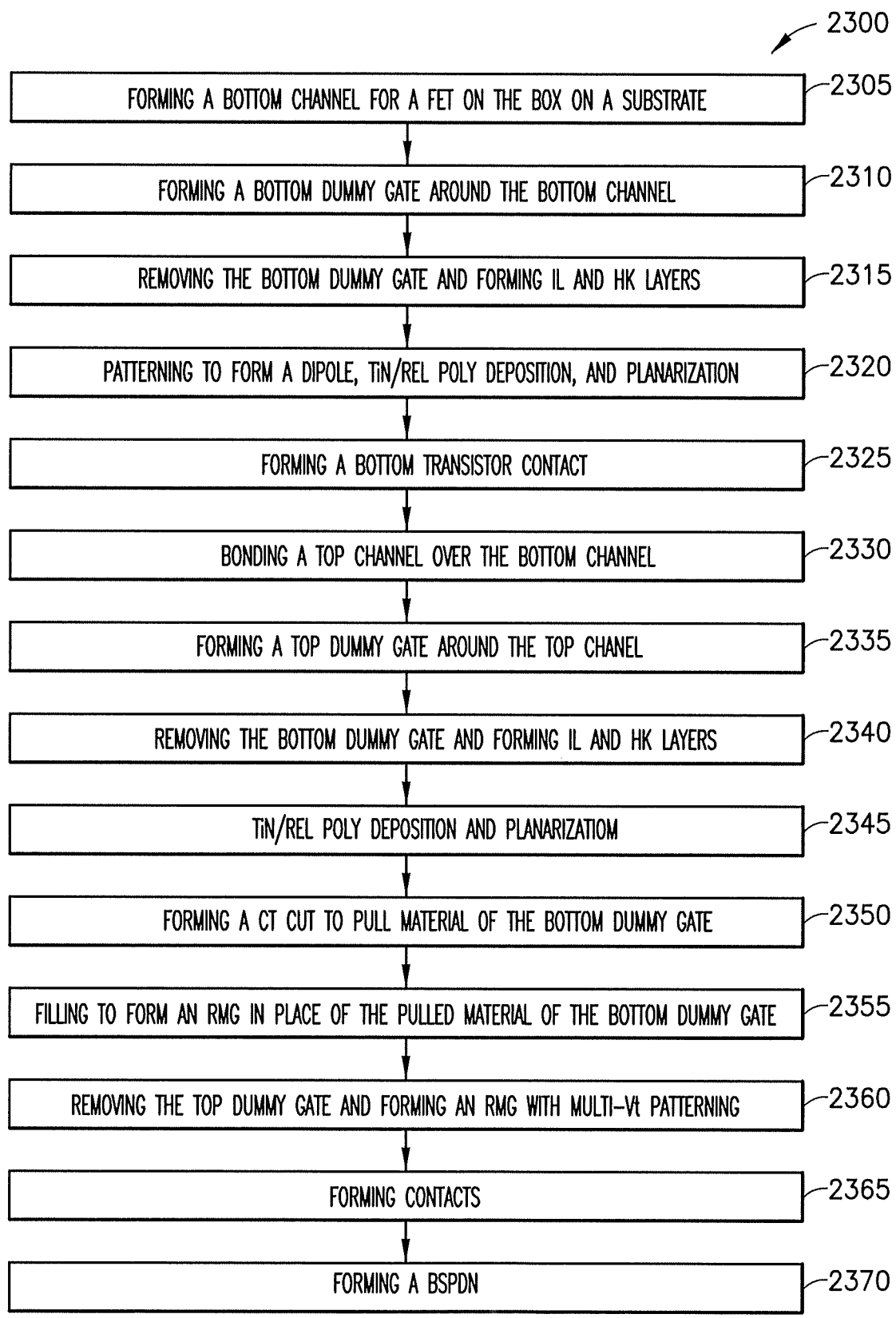

FIGS. 17A, 17B, and 17C are schematic side views of contacts formed in the multi-Vt devices;

FIGS. 18A, 18B, and 18C are schematic side views of the multi-Vt devices after BEOL processing and carrier wafer bonding;

FIGS. 19A, 19B, and 19C are schematic side views of a multi-Vt semiconductor device with non-dipole and/or dipole elements in both the top and bottom layers;

FIGS. 20A, 20B, and 20C are schematic side views of a multi-Vt semiconductor device having a contact through a top layer to a dielectric layer;

FIGS. 21A, 21B, and 21C are schematic side views of the multi-Vt semiconductor device of FIGS. 20A, 20B, and 20C after BEOL processing and carrier wafer bonding;

FIGS. 22A, 22B, and 22C are schematic side views of the multi-Vt devices after BEOL processing and carrier wafer bonding; and FIG. 23 is a flow chart of one exemplary method of forming a multi-Vt semiconductor device in which FETs are stacked.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments described herein offer a multiple threshold voltage (multi-Vt) semiconductor package in which at least one field effect transistor (FET) is positioned over a second FET such that the two FETs are separated by an isolation insulator layer. As used herein, a threshold voltage (Vt) of a FET is a minimum gate voltage needed to create a conducting path between the source and drain of the FET. In such a package, a top gate dielectric may be connected to the isolation insulator layer, but a bottom gate dielectric may be connected only on a sidewall of the bottom gate. One of the bottom FETs contains a dipole element while another of the bottom FETs contains a non-dipole element. A self-aligned CT cut is positioned between the top and bottom FETs. Self-aligned gate connections are formed between the top and bottom FETs.

Figure 1A:
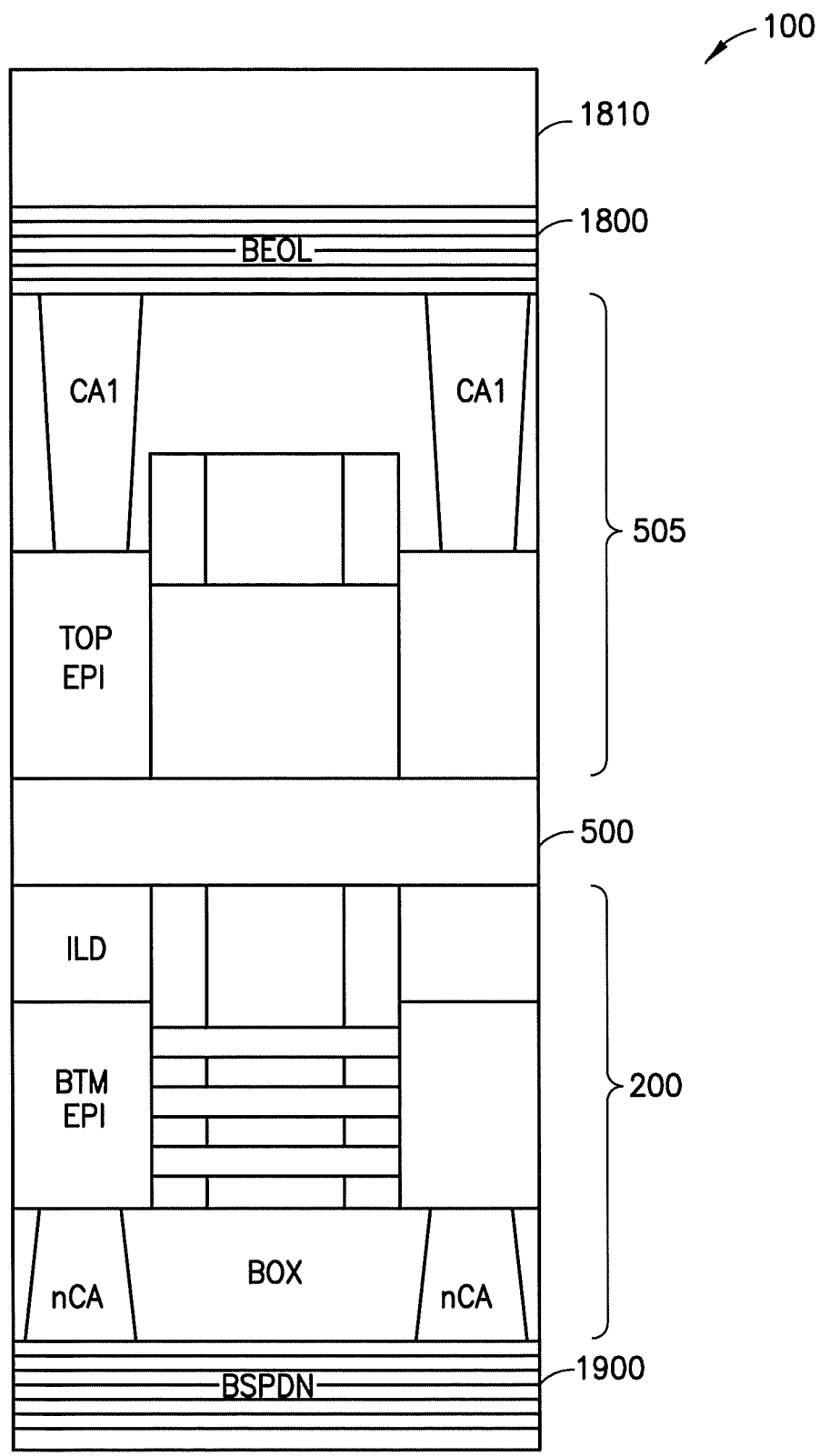
Figure 1B:
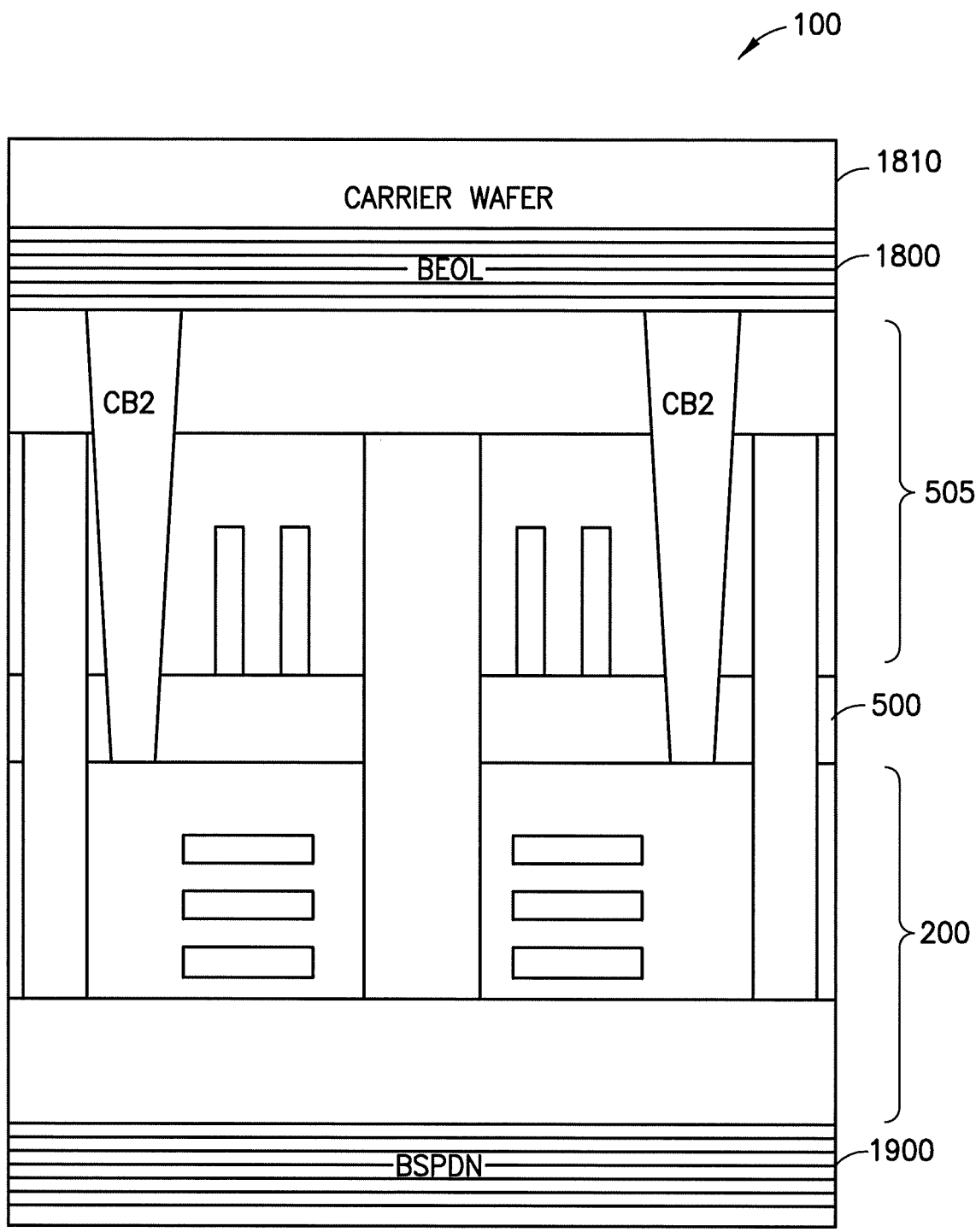
Figure 1C:
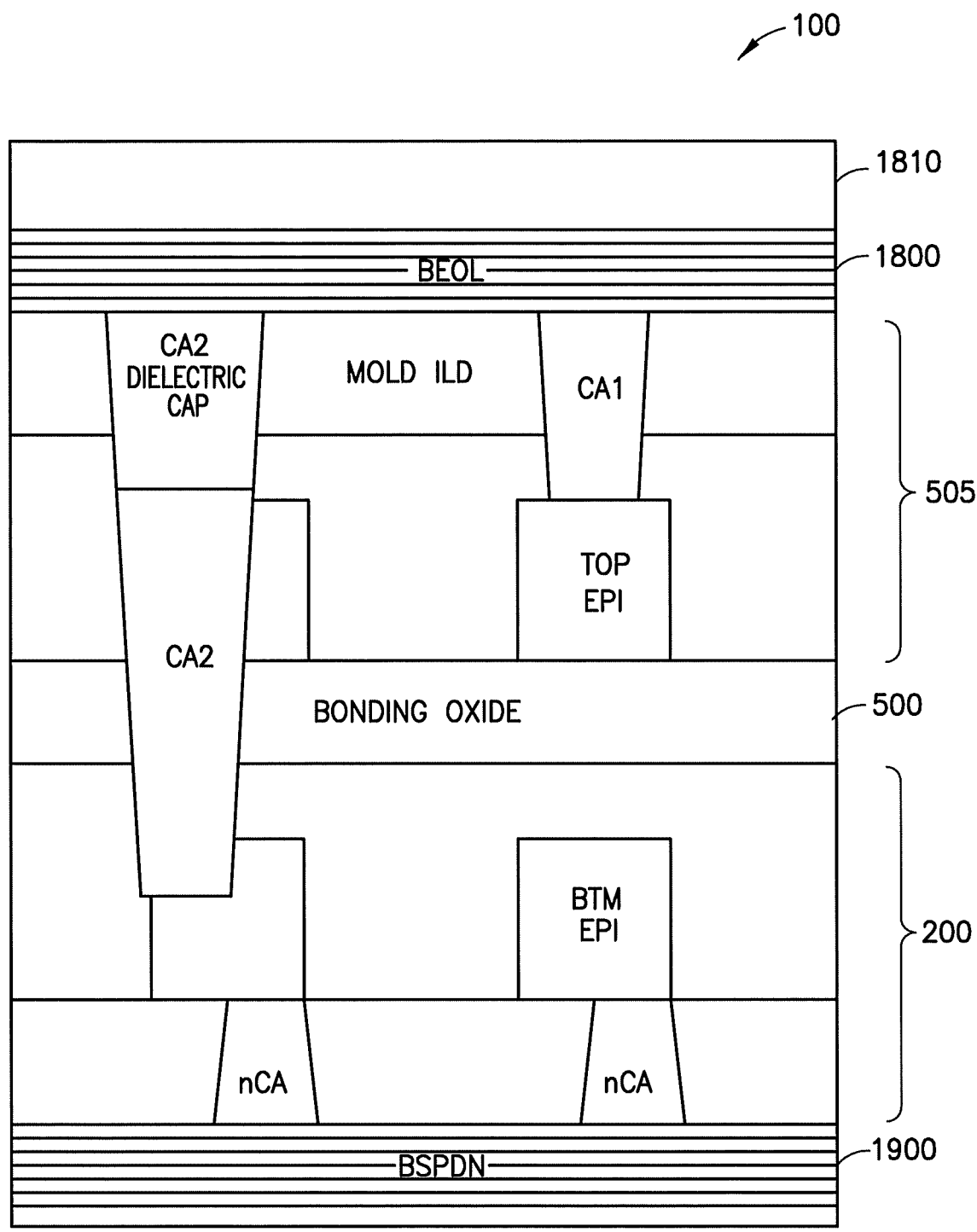

Referring now to the Figures, exemplary methods of fabrication of multi-Vt semiconductor packages or devices using a front-side fill technique are shown. As shown in FIGS. 1A, 1B, and 1C, a multi-Vt semiconductor device in which FETs are stacked is shown generally at 100 and is hereinafter referred to as "semiconductor device 100." As shown, the semiconductor device 100 includes two finned FET devices in a top layer 505, each of the two finned FET devices being "stacked" over a corresponding FET having a non-dipole element and a FET having a dipole element in a bottom layer 200, the top layer 505 and the bottom layer 200 being coupled by a bonding oxide layer 500. The bottom layer 200 is connected to a backside power distribution network (BSPDN). The top layer 505 is connected to a back-end-of-line layer 1800 (BEOL 1800). A carrier wafer 1810 is disposed on the BEOL 1800.

Figure 2A:
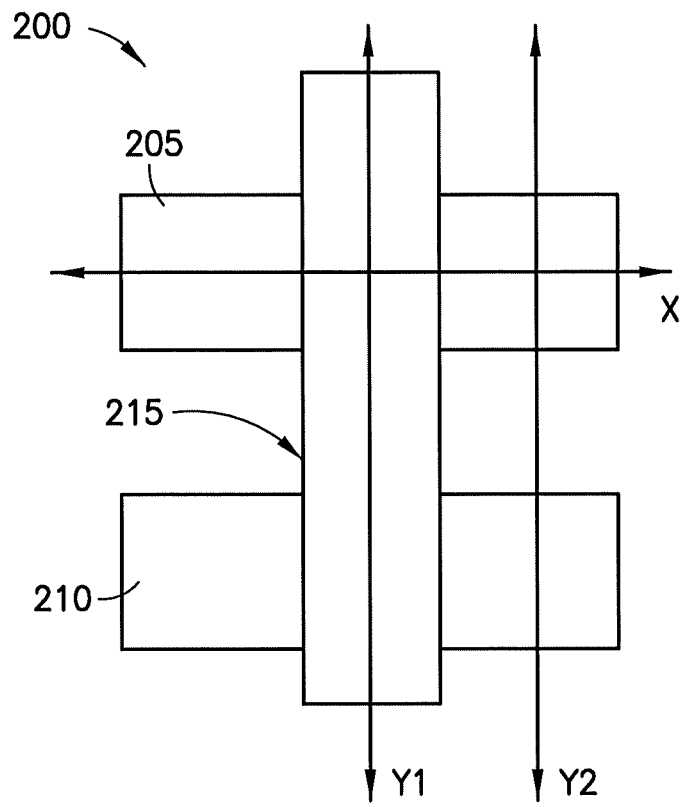

FIGS. 2A through 18C illustrate one exemplary method of fabricating the semiconductor device 100. As shown in FIG. 2A, a top view of FETs of the bottom layer is shown at 200 (bottom layer 200). The FETs include a first structure 205 and a second structure 210 that subsequently each form both the non-dipole element and the dipole element, the non-dipole element and the dipole element being adjacently positioned and extending in the X direction. A supporting structure 215 is positioned perpendicular to the first structure 205 and the second structure 210 and extends in the Y direction.

Figure 2B:
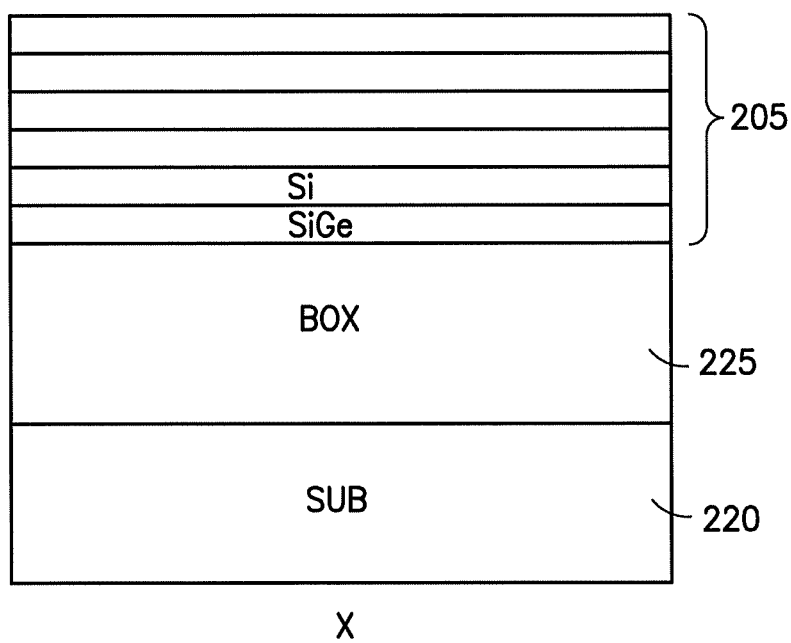
Figure 2C:
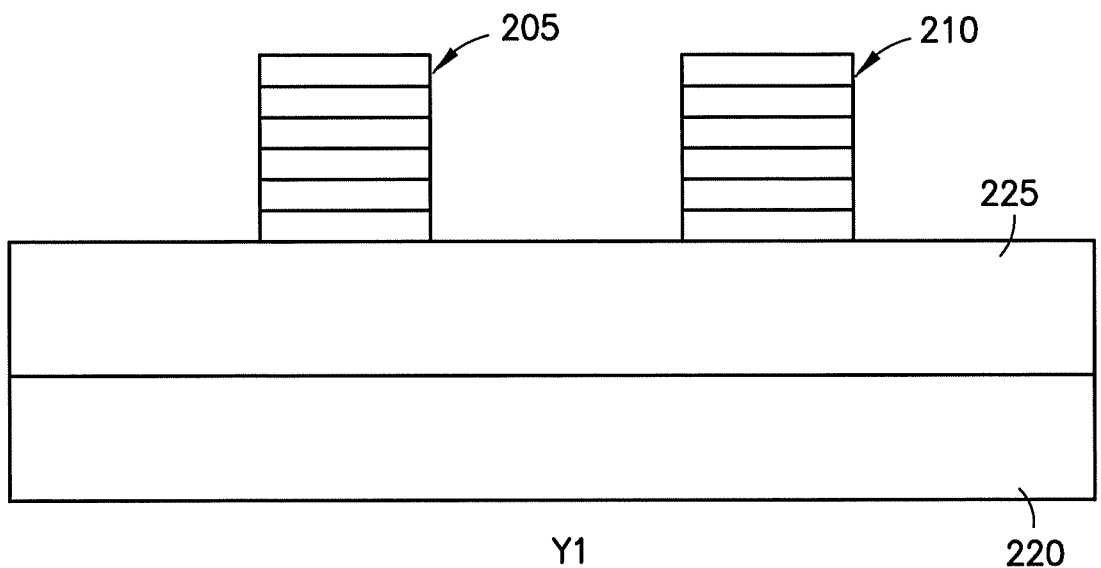
Figure 2D:
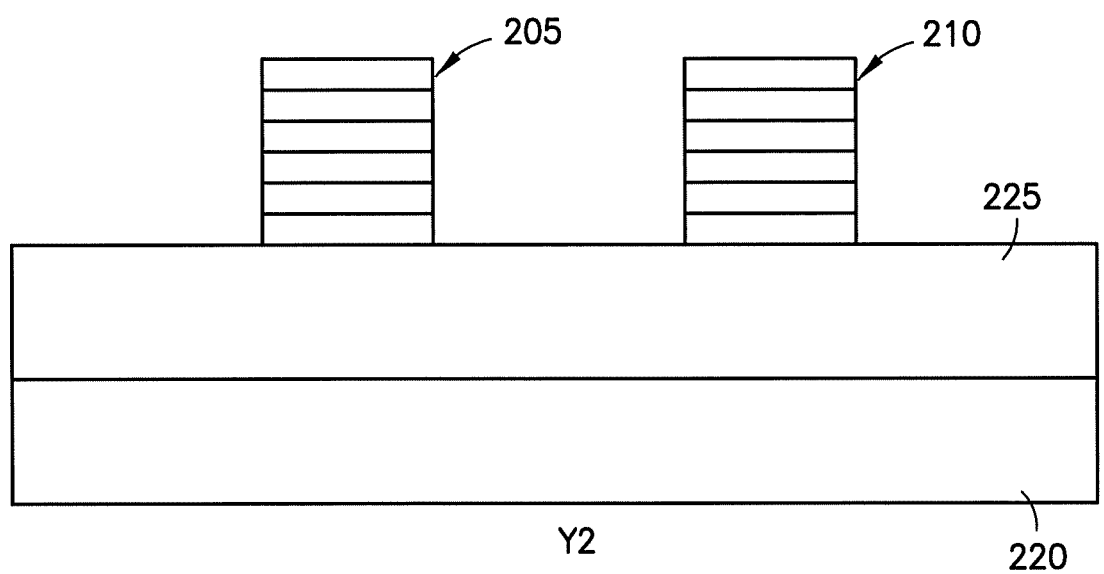

FIGS. 2B, 2C, and 2D illustrate initial steps in the fabrication of the bottom layer 200 and show cross-sectional views taken along lines X, Y1, and Y2, respectively, in accordance with exemplary embodiments as disclosed. As shown, the supporting structure 215 comprises a substrate 220 (for example, silicon) on which a buried oxide (BOX) layer 225 is formed. Alternating layers of silicon germanium (SiGe) and silicon (Si) are deposited on the BOX layer 225. After bottom NS patterning and etch, the first structure 205 and the second structure 210 extend from an upper surface of the BOX layer 225, the individual sets of layers comprising alternating layers of SiGe and Si.

Figure 3A:
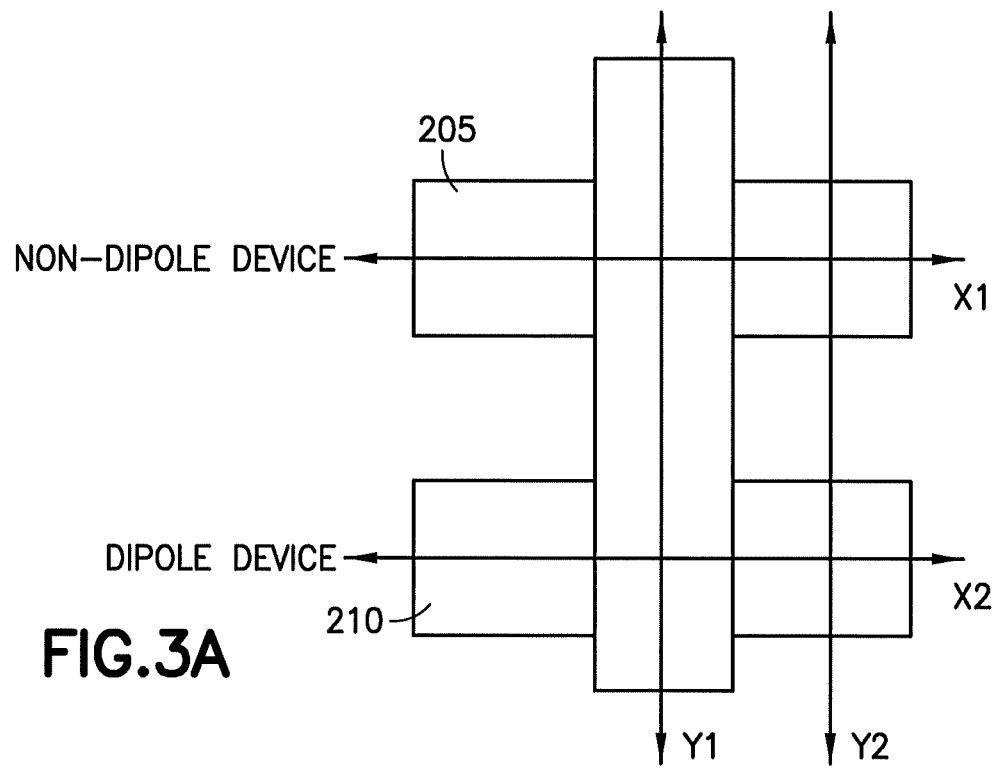

As shown in FIG. 3A, the first set of layers of the first structure 205 define a channel that will subsequently be defined as the FET having the non-dipole element, and the second set of layers of the second structure 210 define a channel that will subsequently be defined as the FET having the dipole element. The first set of layers forming the non-dipole element can be or is associated with a first Vt corresponding to a lack of a dipole layer, and the second set of layers forming the dipole element can be or is associated with a second Vt corresponding to a dipole layer.

Figure 3B:
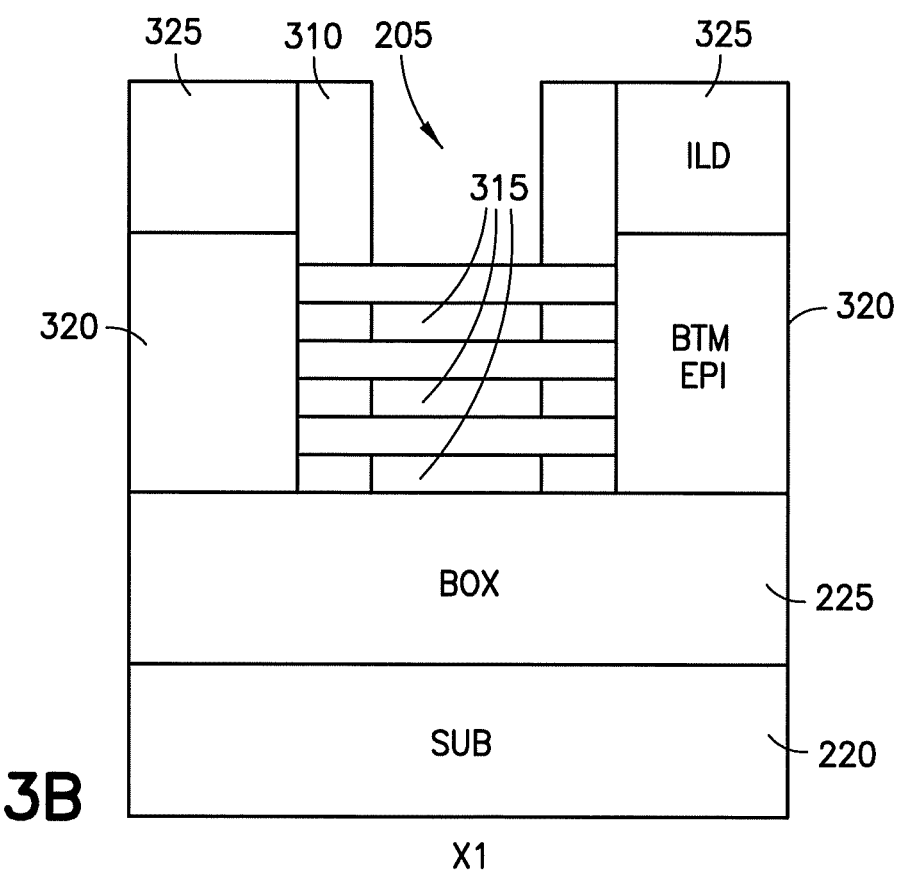
Figure 3C:
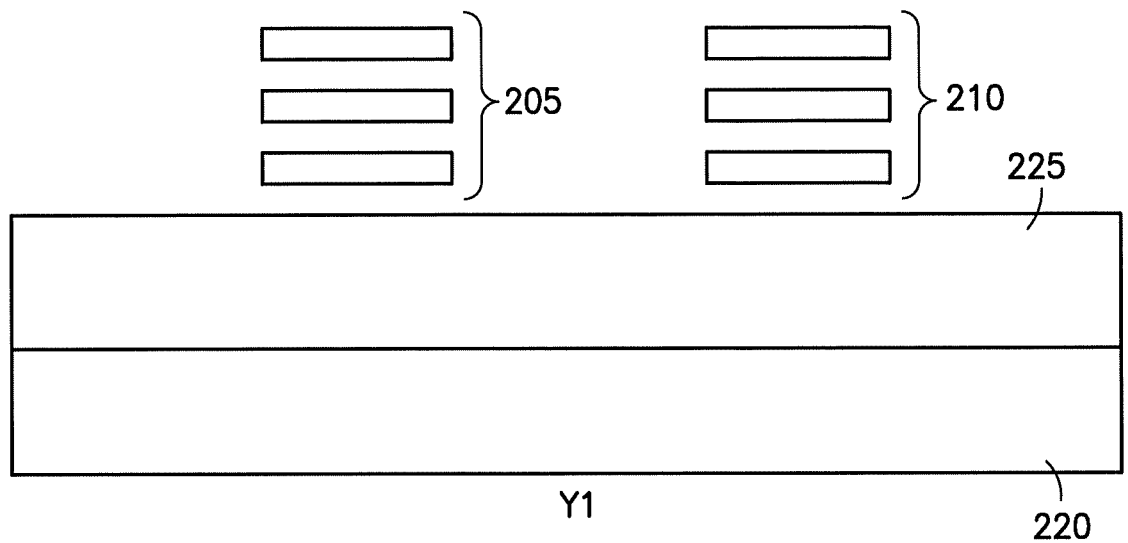
Figure 3D:
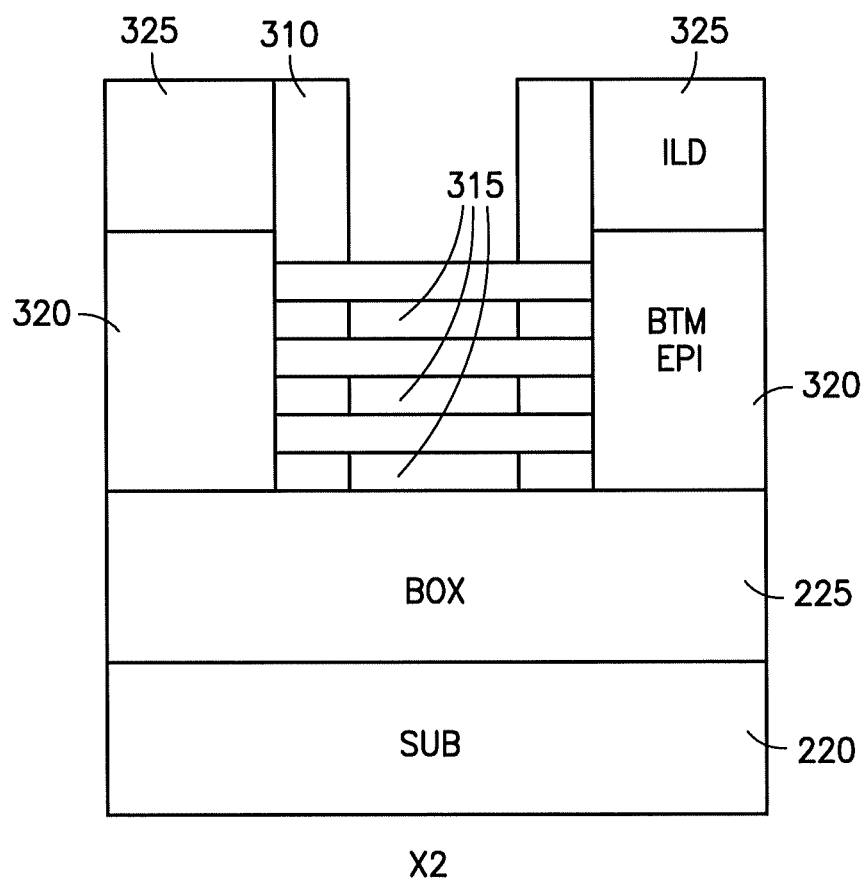

As shown in FIGS. 3B, 3C, and 3D (along the X1, Y1, and X2 dimensions as shown in FIG. 3A), spacers 310 are formed around the first structure 205 and the second structure 210. The SiGe is removed, thereby leaving openings 315 between and around the Si in preparation for a deposited dummy gate. High-k dielectric material is epitaxially deposited on the BOX layer 225 (shown at 320). An interlayer dielectric 325 (ILD 325) (for example, silicon dioxide) is deposited on the layer 320. Dipole patterning and processing is then carried out on the Si of the second structure 210 to form a dipole element.

Figure 4A:
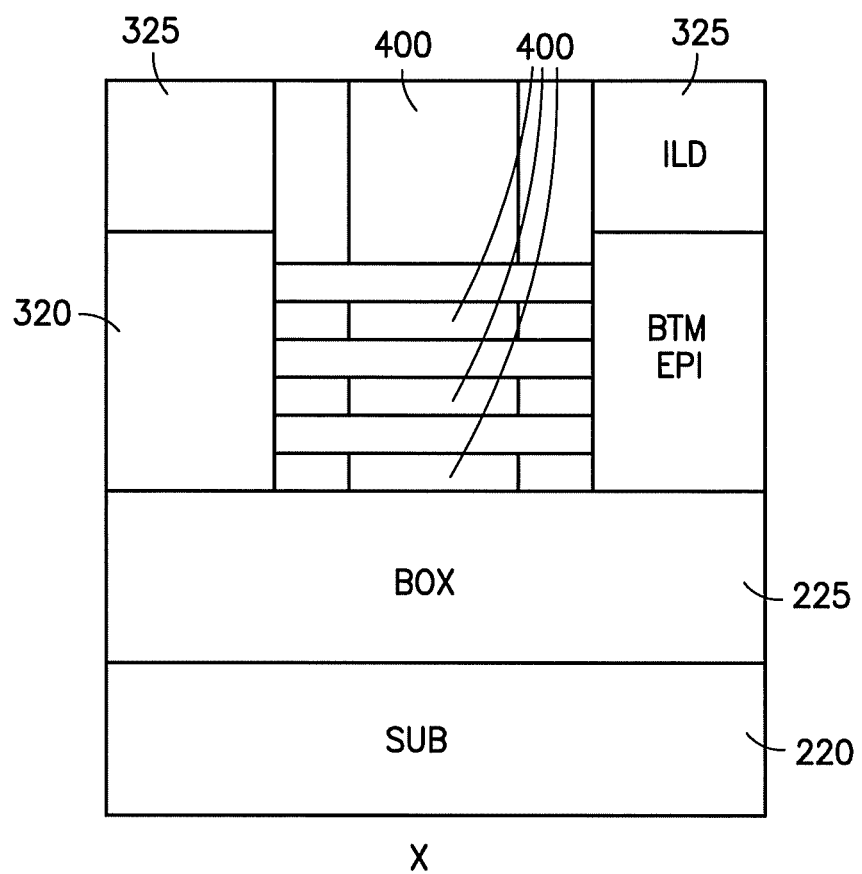
Figure 4B:
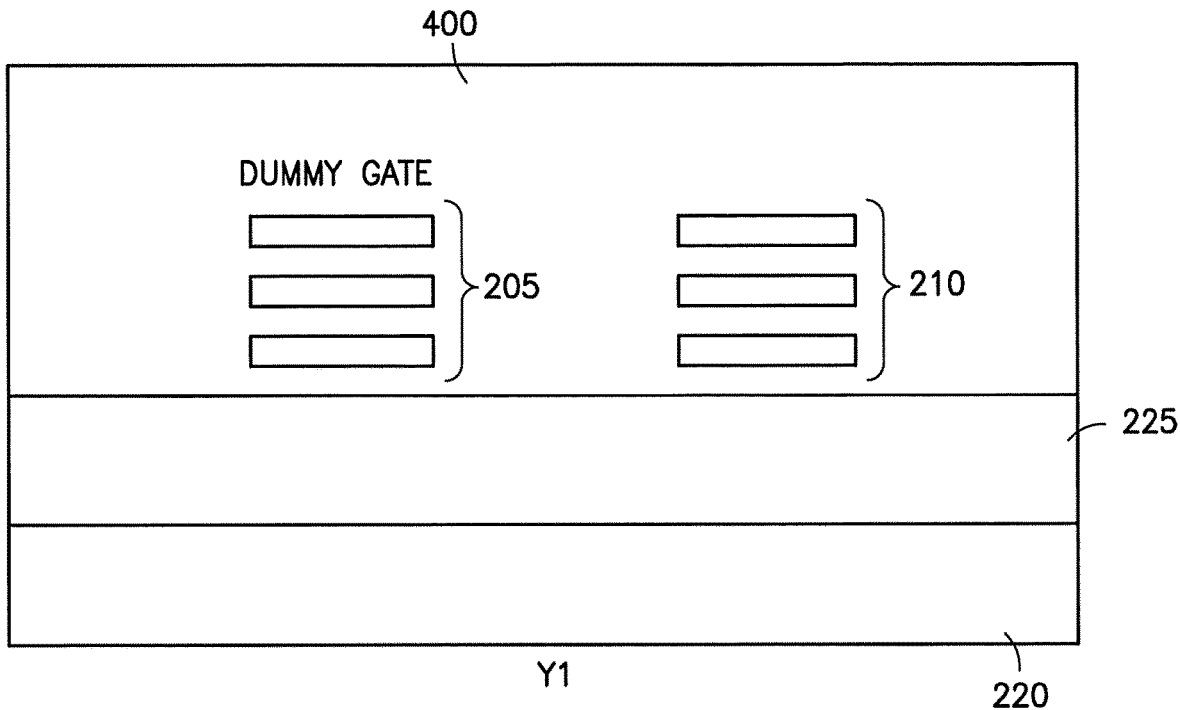
Figure 4C:
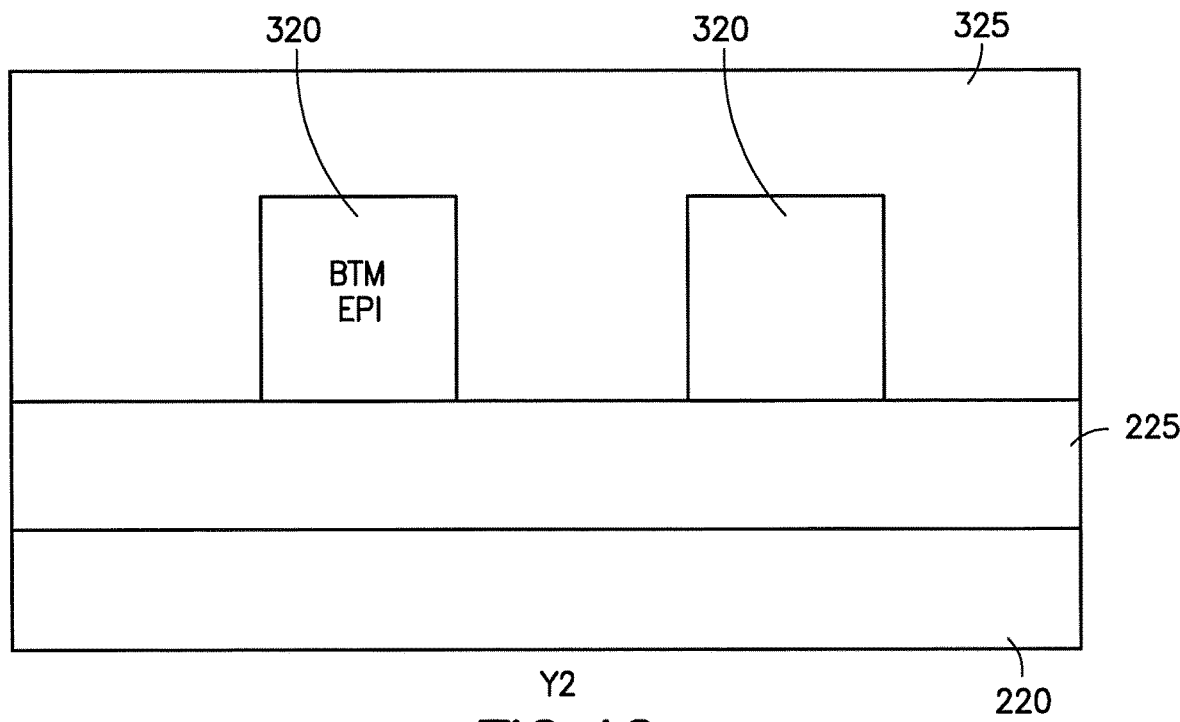

As shown in FIGS. 4A, 4B, and 4C, a bottom dummy gate 400 is formed in the openings 315 around the first set of layers of the first structure 205 and the second set of layers of the second structure 210 (the second set of layers forming the dipole element). Material of the bottom dummy gate 400 may be polysilicon.

Figure 5A:
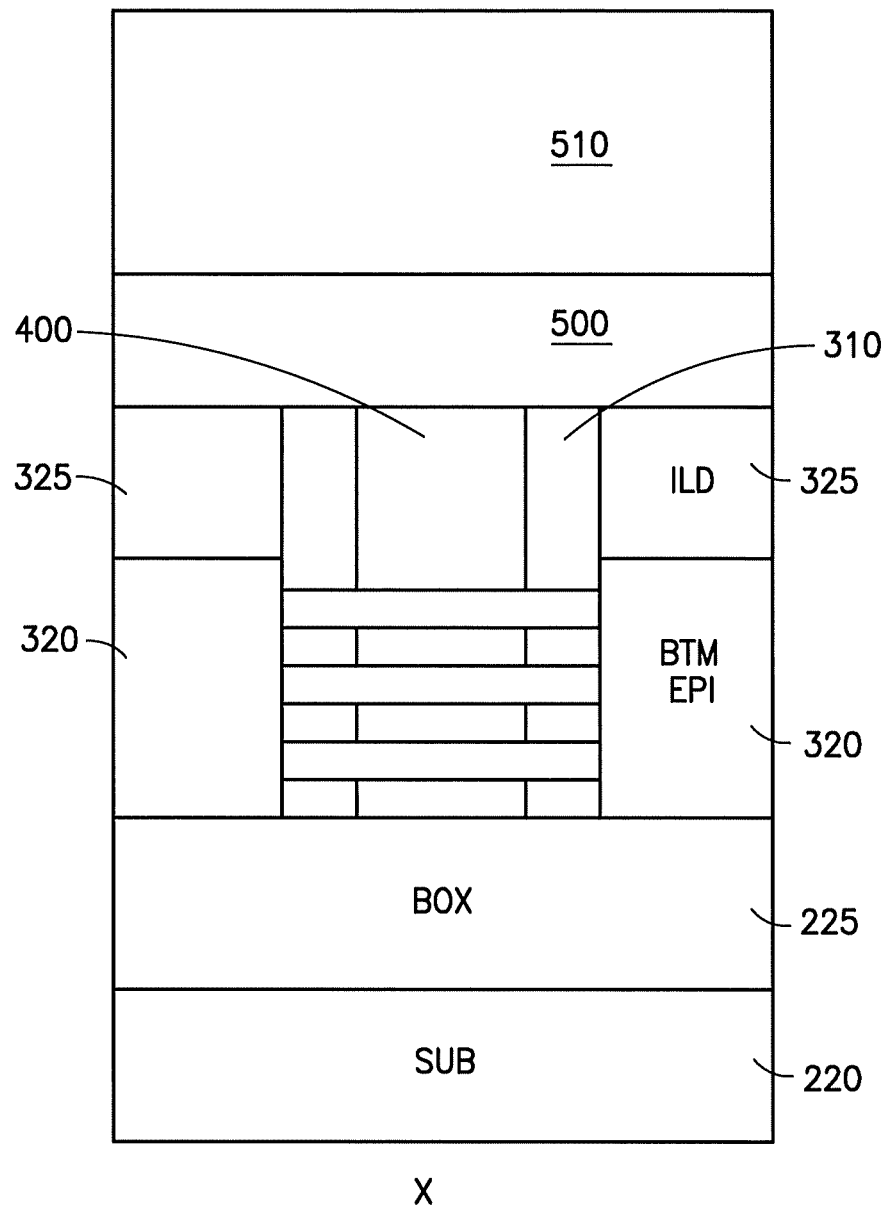
Figure 5B:
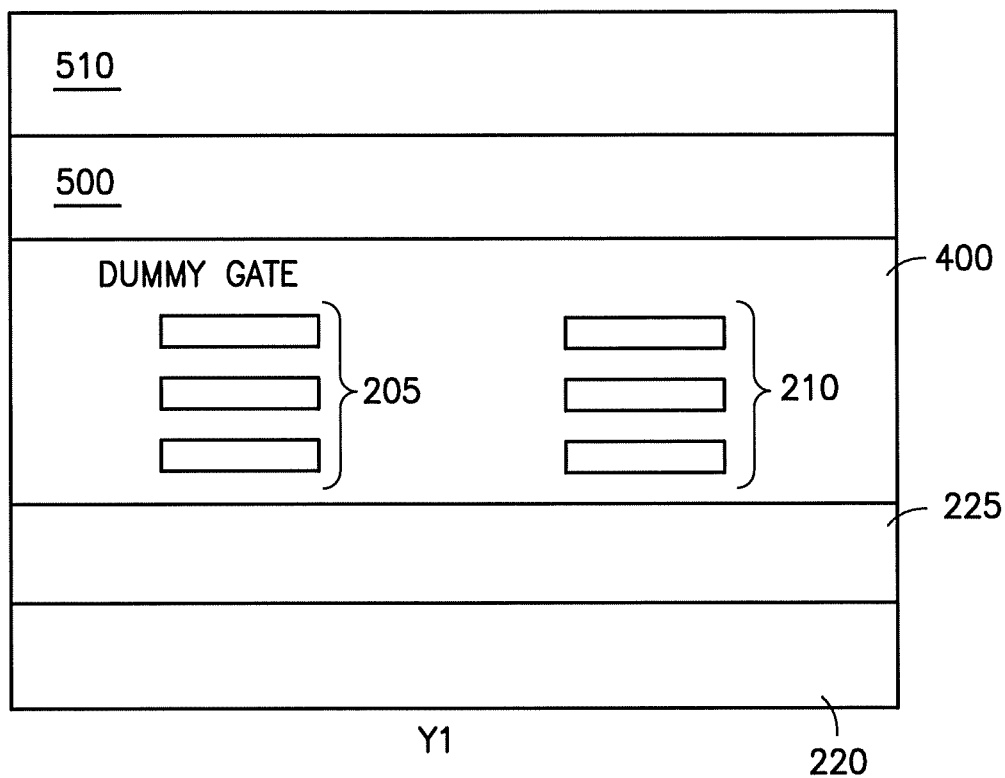
Figure 5C:
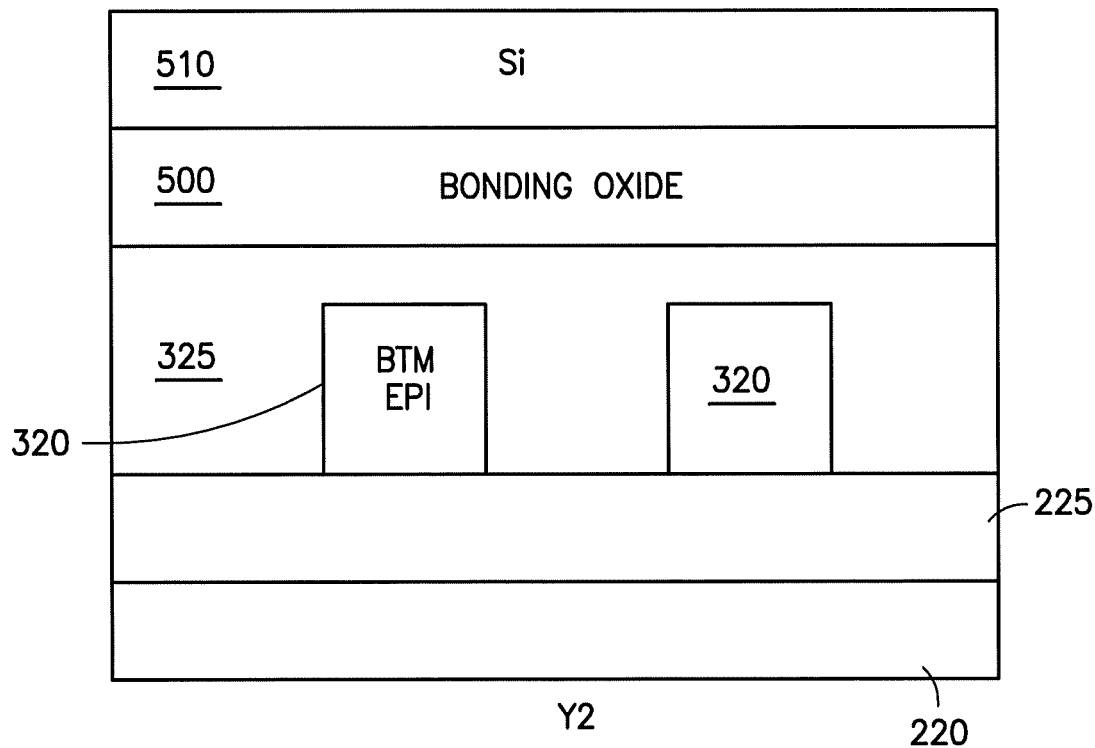

As shown in FIGS. 5A, 5B, and 5C, a bonding oxide layer 500 is deposited onto top surfaces of the bottom dummy gate 400, upper edges of the spacers 310, and the ILD 325 in preparation for bonding channels for one or more top devices in the top layer 505. A layer of Si 510 is deposited onto the bonding oxide layer 500.

Figure 6A:
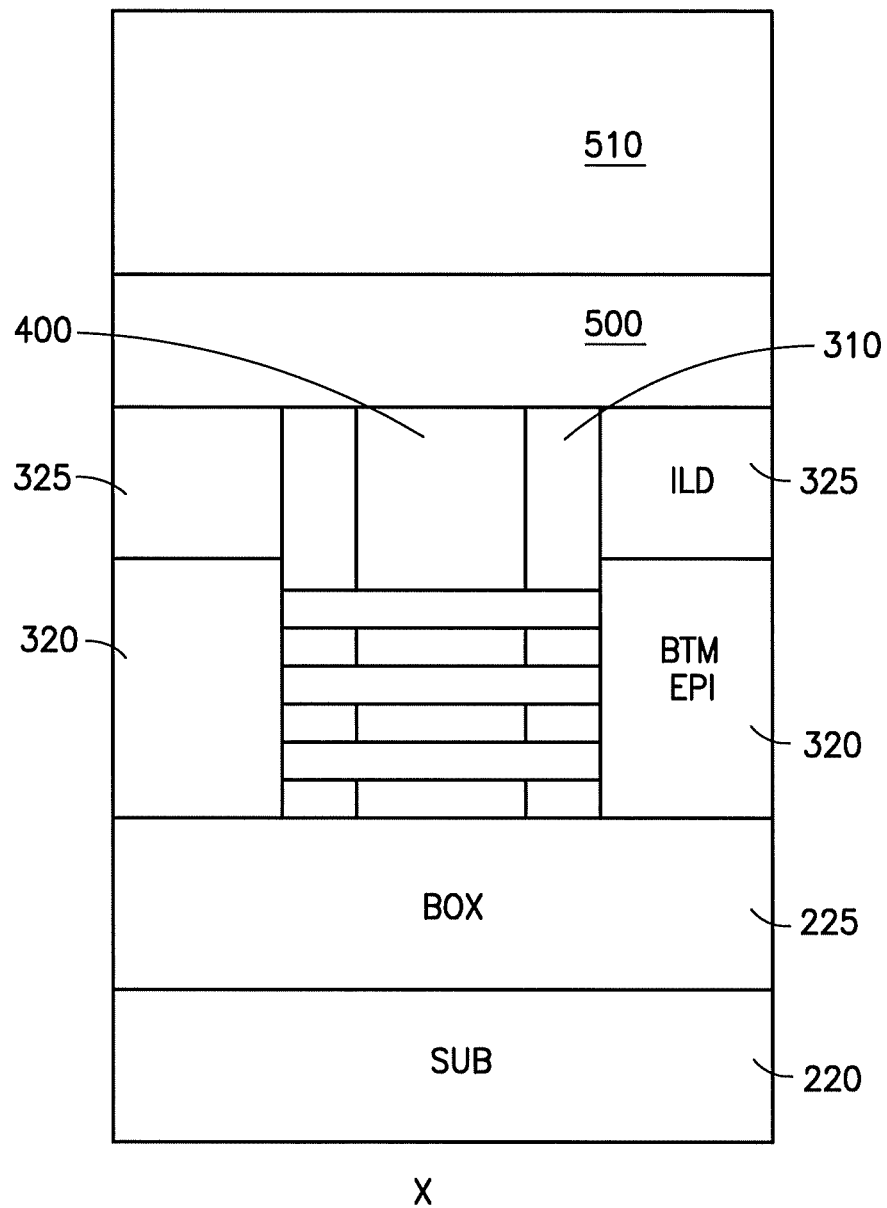
Figure 6B:
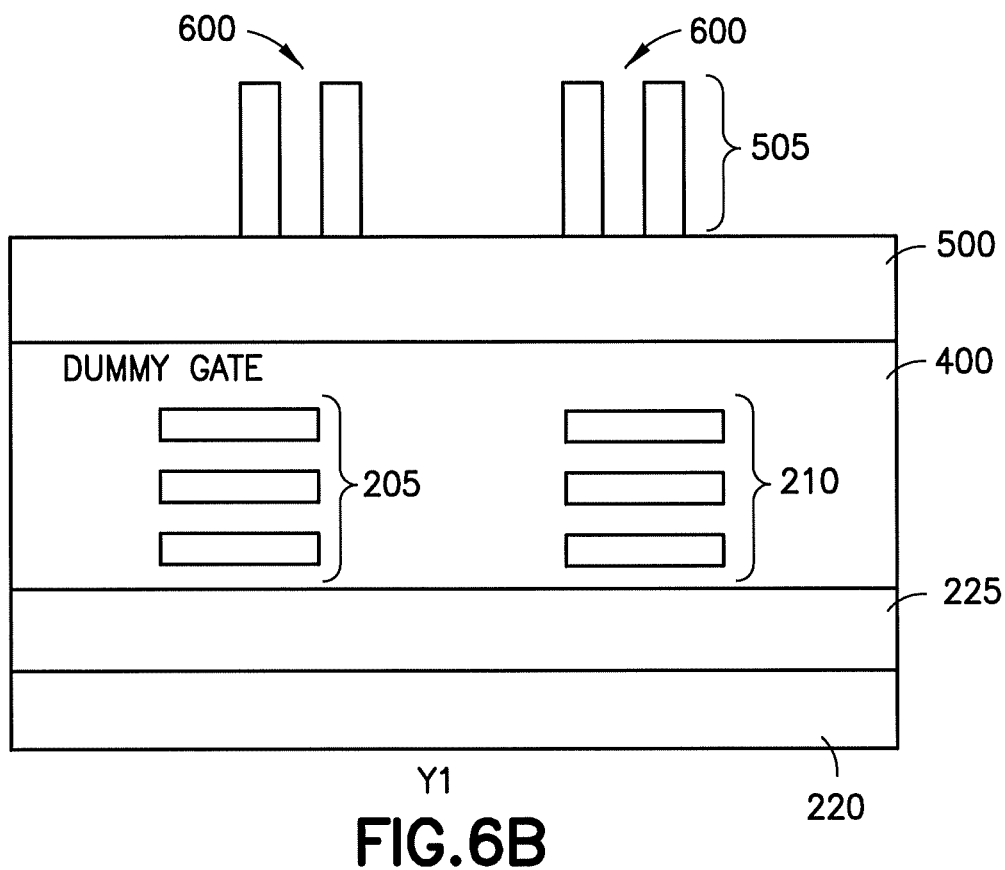
Figure 6C:
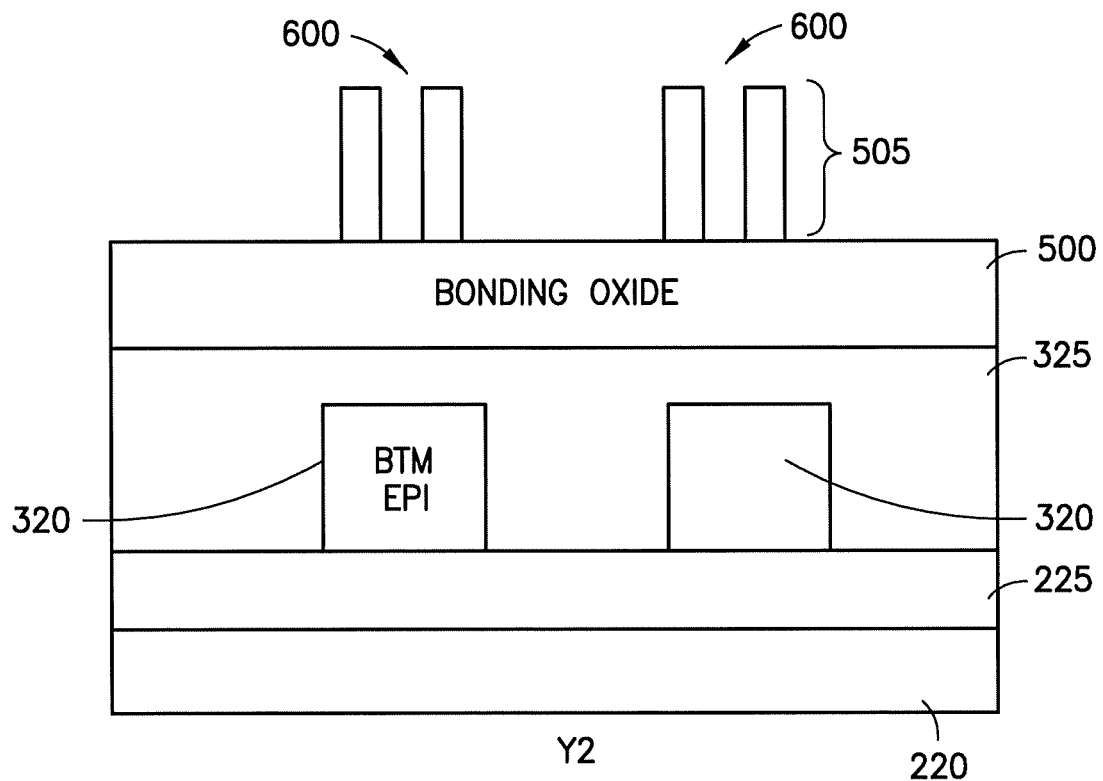

As shown in FIGS. 6A, 6B, and 6C, channels in the top layer 505 are fins that are patterned and formed into the layer of Si 510 for finned FET devices 600.

Figure 7A:
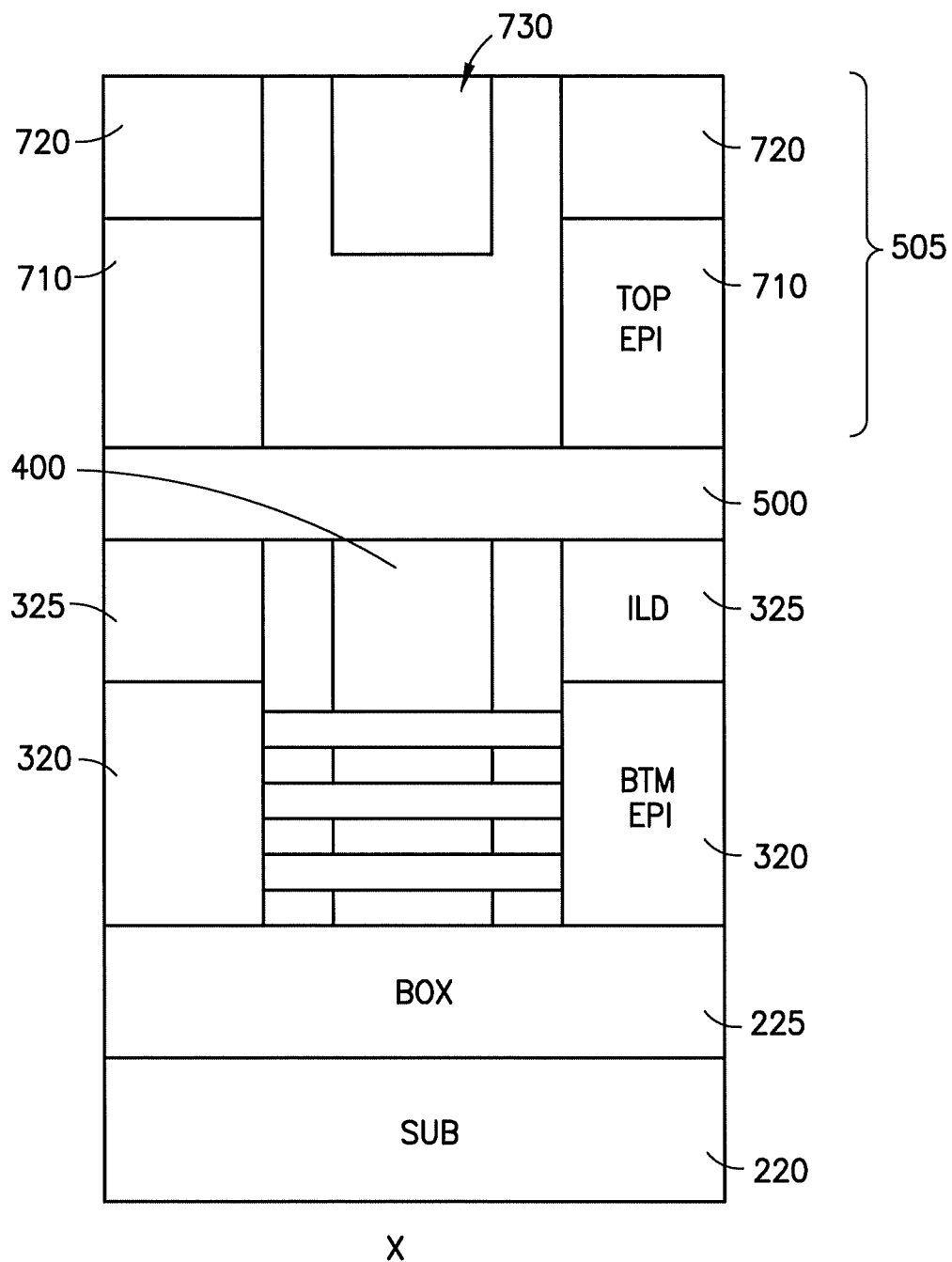
Figure 7B:
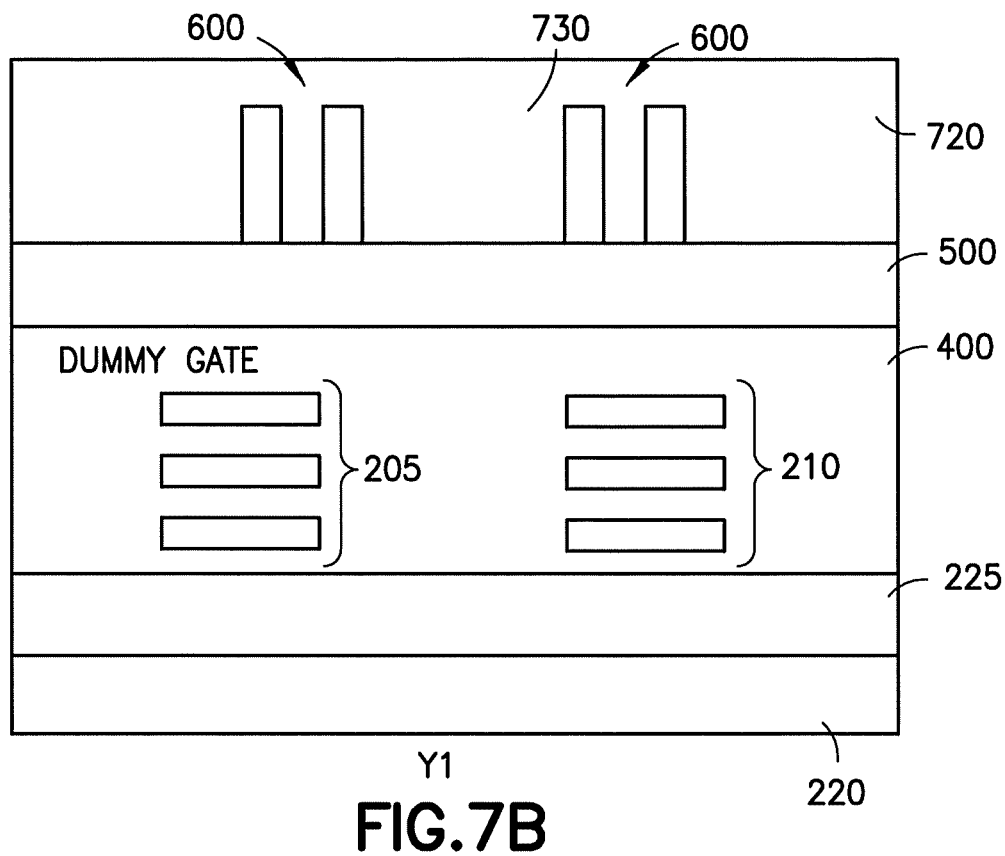
Figure 7C:
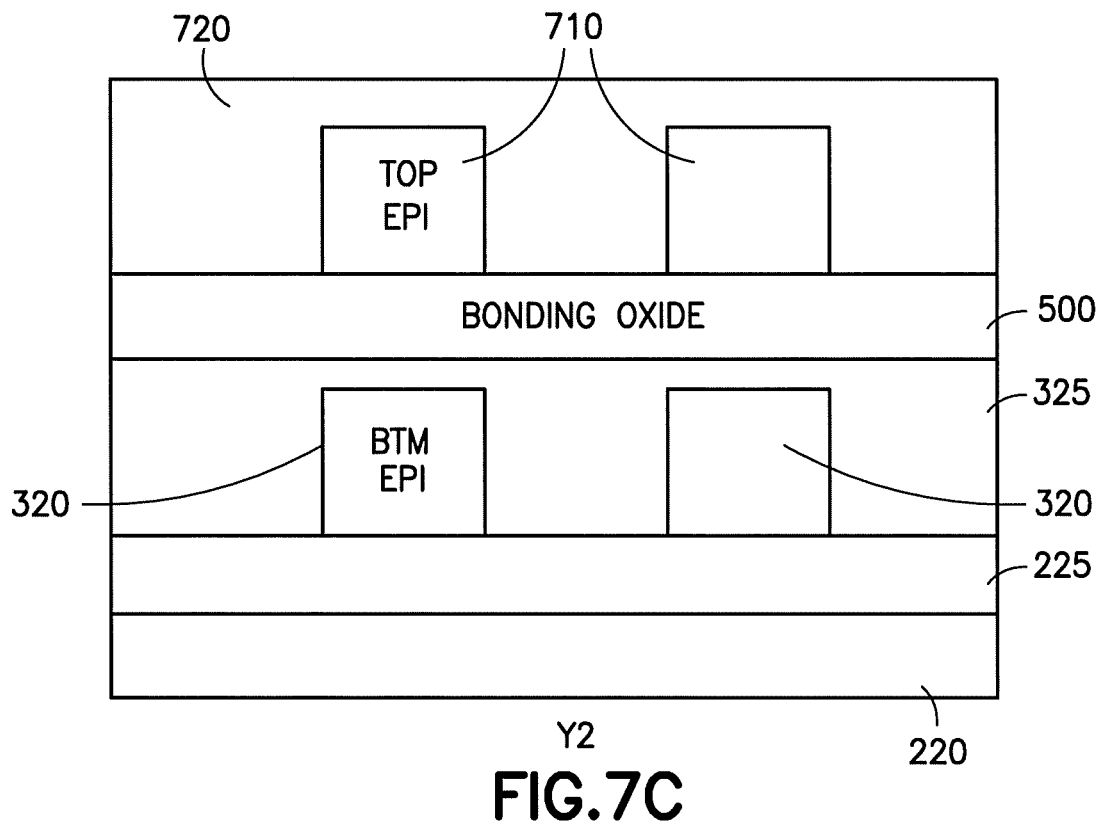

As shown in FIGS. 7A, 7B, and 7C, the top layer 505 is patterned and a high-k dielectric material is epitaxially deposited on the bonding oxide layer 500 to form regions 710. An upper interlayer dielectric 720 (upper ILD 720) is deposited on the upper regions 710. Dipole patterning and processing may then optionally be carried out to form a dipole element in the top layer 505. Polysilicon may be deposited to form an upper dummy gate 730 in the top layer 505.

Figure 8A:
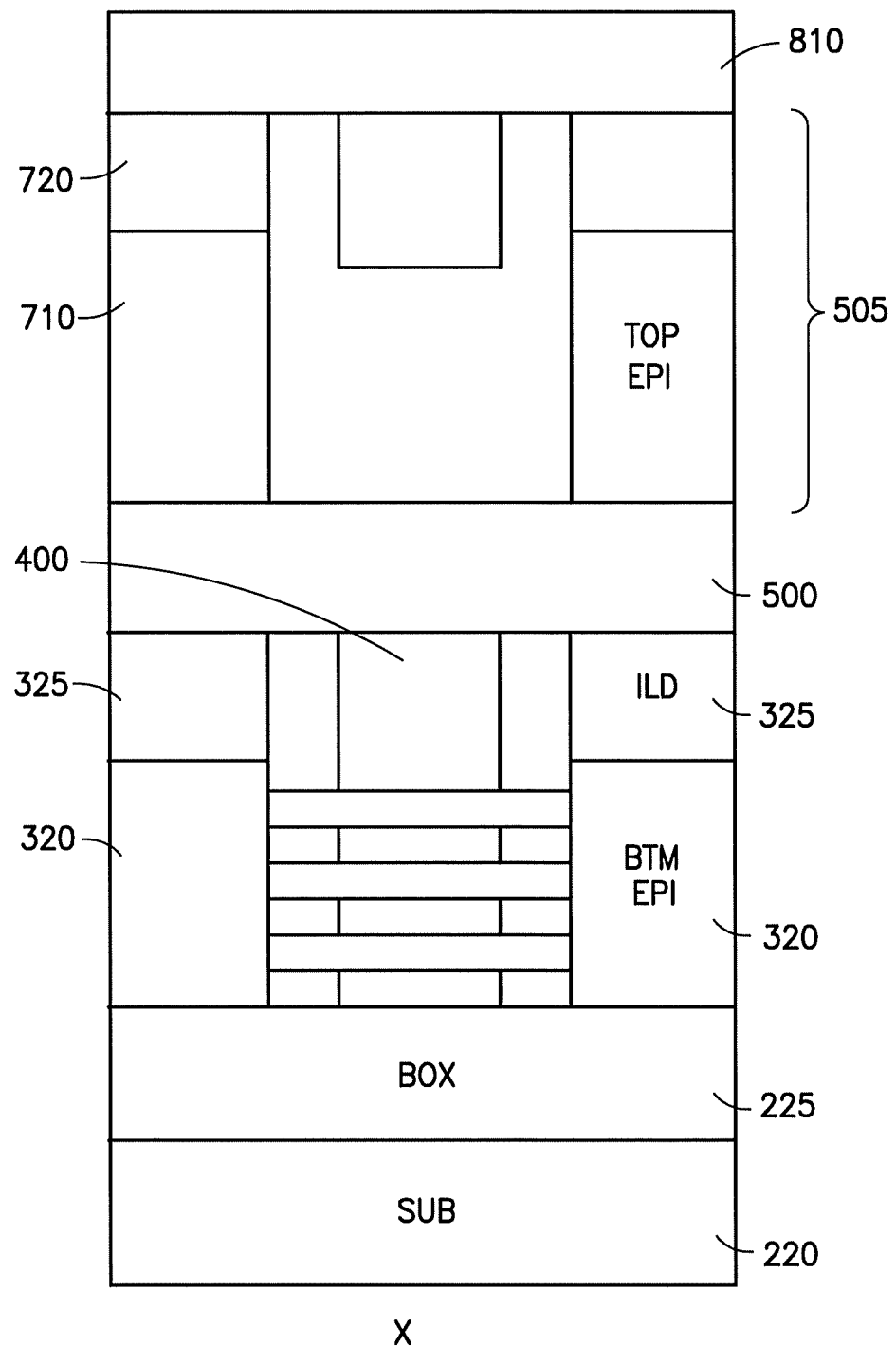
Figure 8B:
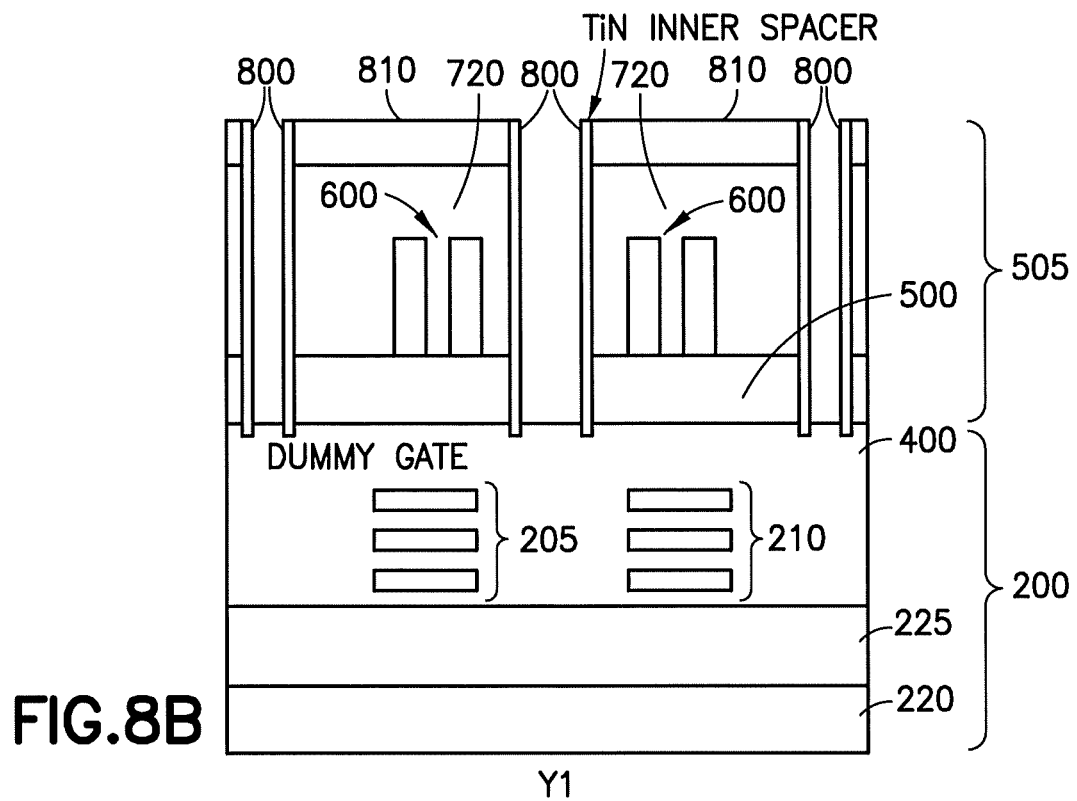
Figure 8C:
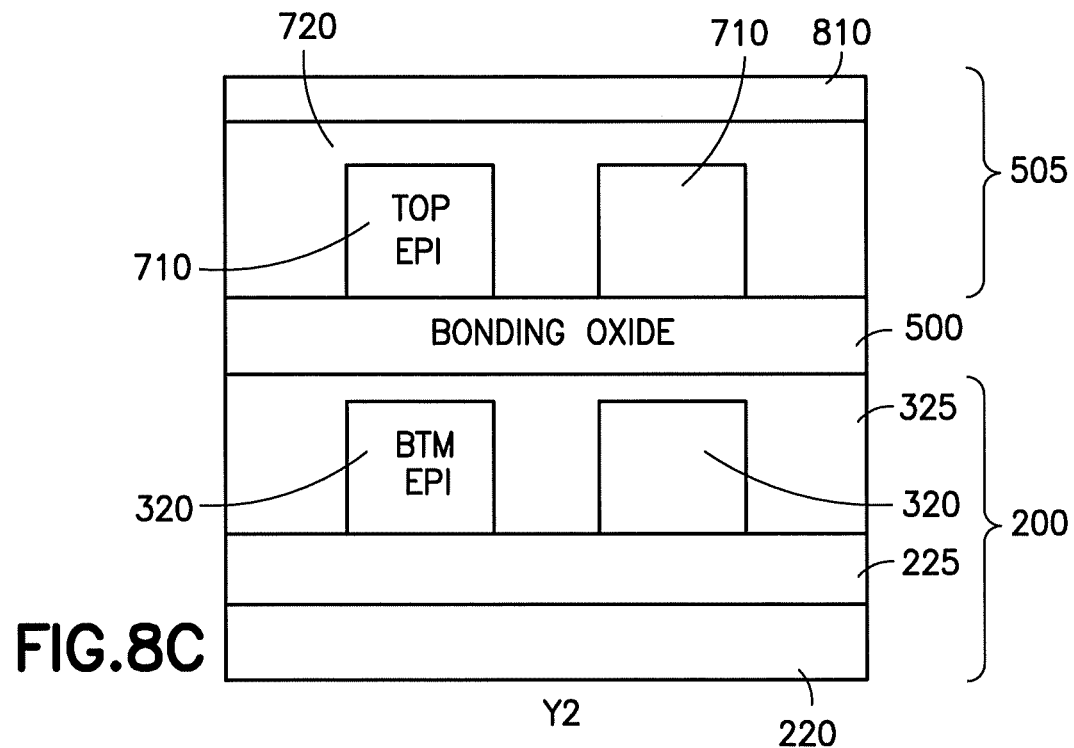

As shown in FIGS. 8A, 8B, and 8C, an ILD layer 810 may be deposited onto upper surfaces of the upper ILD 720. Openings can then be formed in the upper ILD 720 and the remainder of the top layer 505 to open the bottom dummy gate 400 thereby exposing the polysilicon material of the bottom layer 200. Inner spacers 800 may be deposited on sidewalls of the openings. Material of the inner spacers 800 may be TiN.

Figure 9:
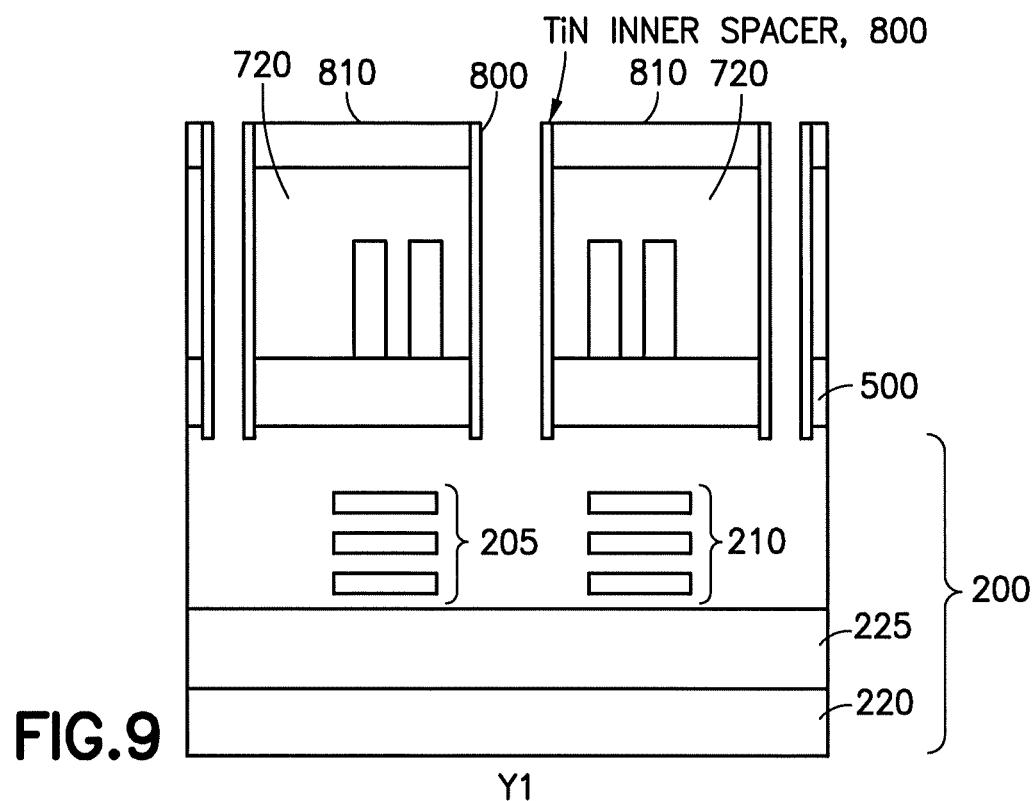
FIG. 9 is a schematic side view of the bottom layer with the dummy gate pulled.

As shown in FIG. 9, the polysilicon is pulled from the bottom layer 200.

Figure 10:
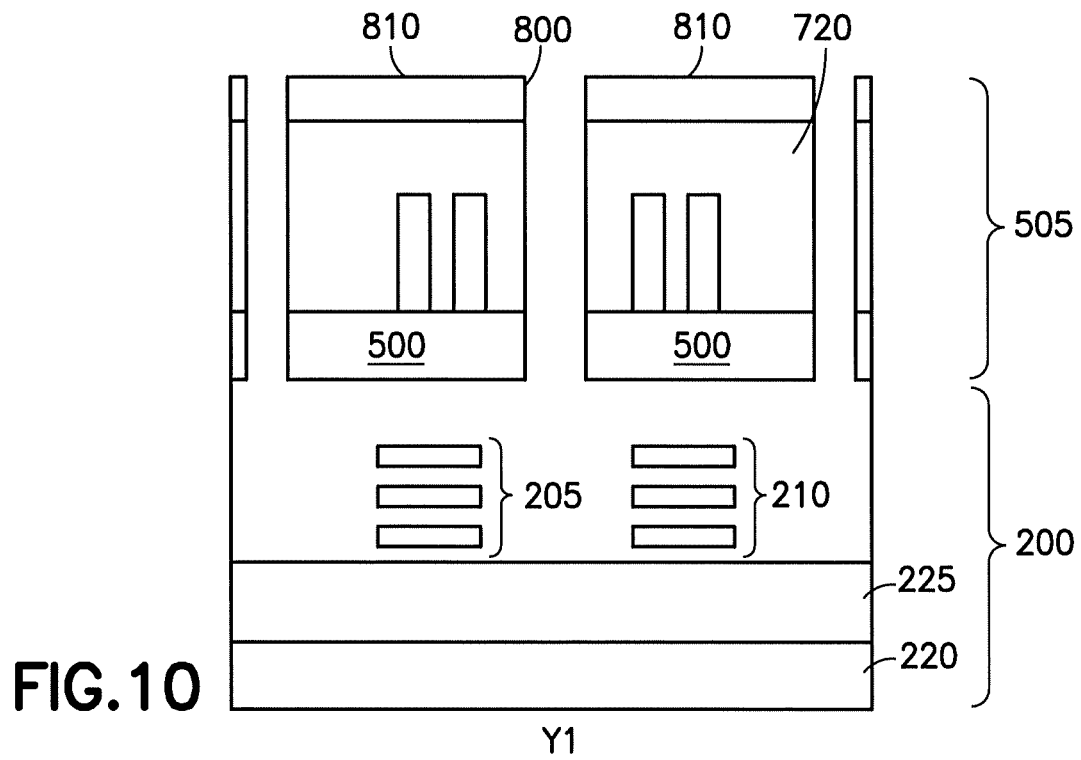
FIG. 10 is a schematic side view of spacers stripped from the openings to the bottom layer.

As shown in FIG. 10, the inner spacers 800 are stripped from the sidewalls of the openings. The polysilicon pull and the stripping of the inner spacers 800 results in a void in the overall semiconductor device 100 with the FETs in the top layer 505 being stacked over the FETs in the bottom layer 200.

Figure 11:
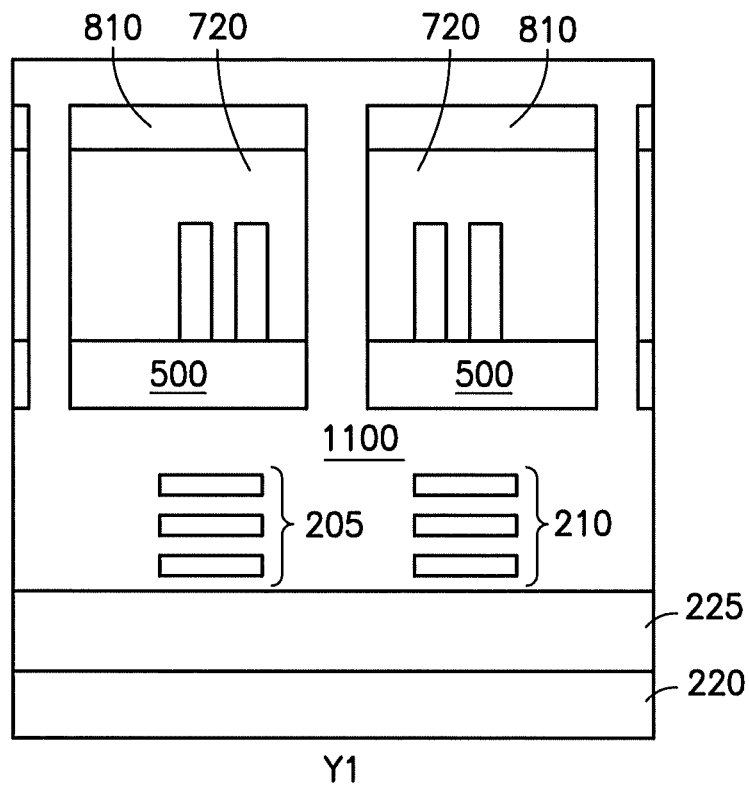
FIG. 11 is a schematic side view of a metal deposited in the top and bottom layers.

As shown in FIG. 11, a metal fill is deposited into the void as a gate material 1100. The metal fill may be any suitable metal or alloy. In doing so, the gate material 1100 is connected to the insulation layer (bonding oxide layer 500).

Figure 12:
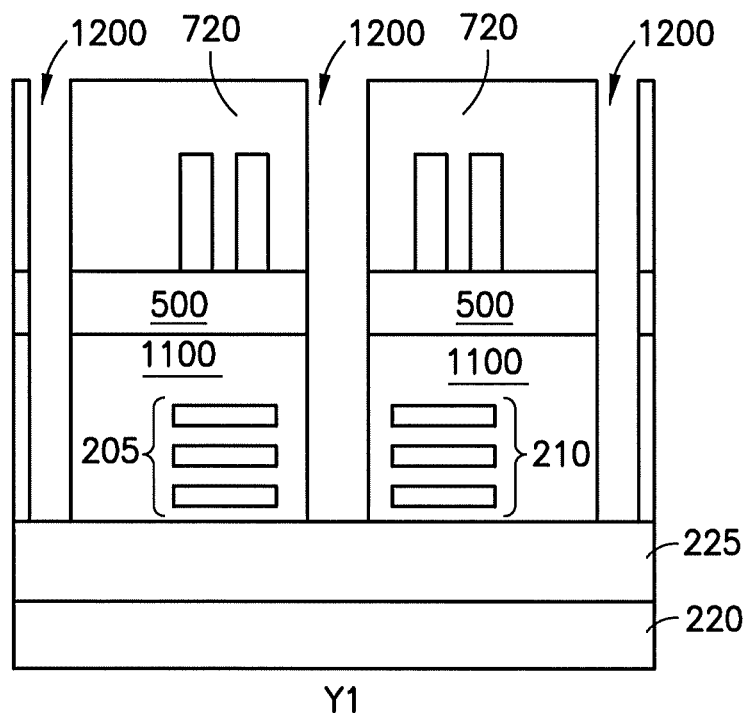
FIG. 12 is a schematic side view of gate cuts into the deposited metal of the top and bottom layers.

As shown in FIG. 12, first gate cuts 1200 are made between stacked FETs. Upper layers of the metal fill and the ILD layer 810 are removed.

Figure 13:
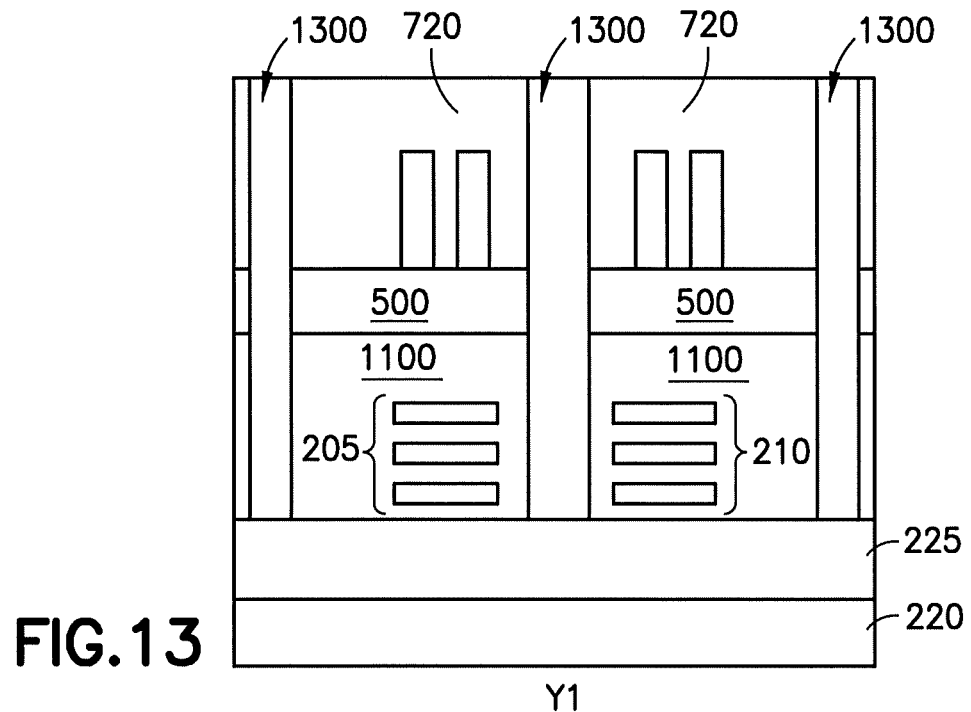
FIG. 13 is a schematic side view of the gate cuts filled with metal.

As shown in FIG. 13, the first gate cuts 1200 are filled with suitable metal to form fills 1300. The top gates are aligned with the bottom gates.

Figure 14:
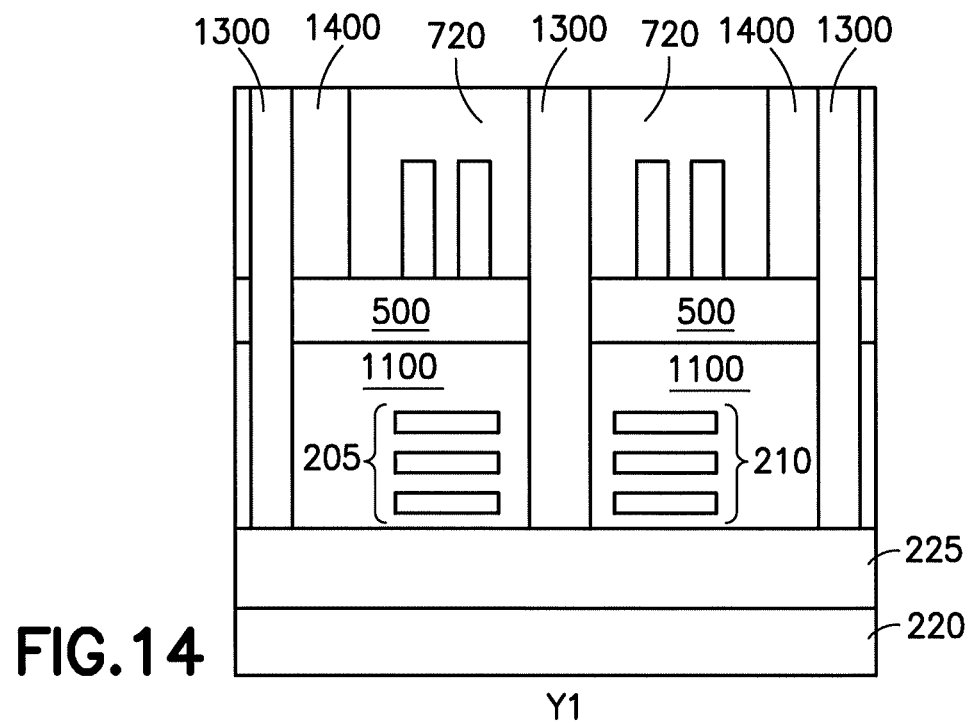
FIG. 14 is a schematic side view of additional gate cuts into the top layer to form bottom transistor gate pickups.

As shown in FIG. 14, second gate cuts are made in the top layer 505 and filled with suitable metal to provide bottom transistor gate pickups 1400.

Figure 15A:
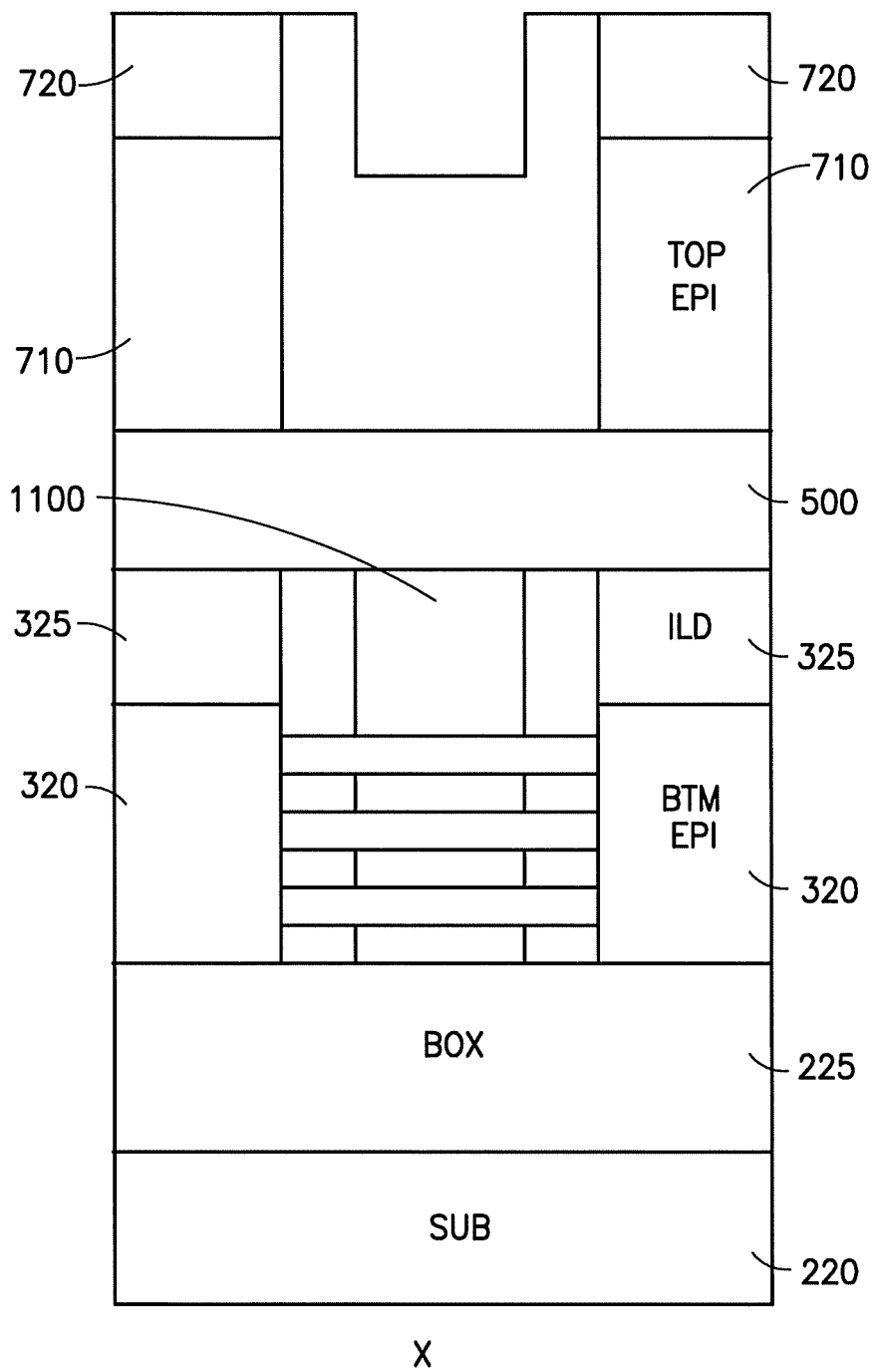
FIGS. 15A and 15B are schematic side views of a dummy gate pull from the top layer.
Figure 15B:
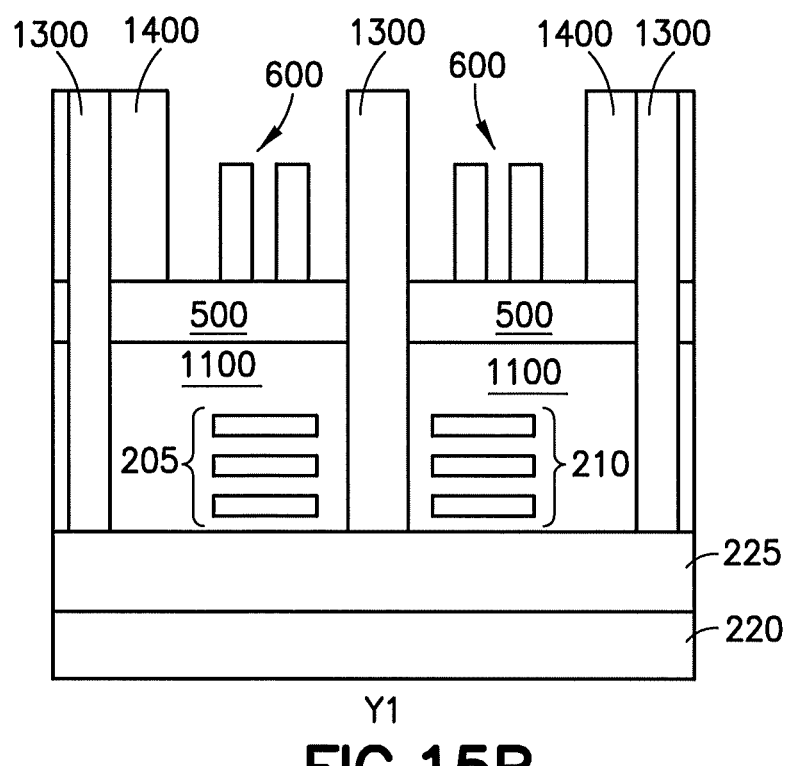

As shown in FIGS. 15A and 15B, the polysilicon of the upper dummy gate 730 in the top layer 505 is removed, thereby leaving a void around the finned FET devices 600.

Figure 16A:
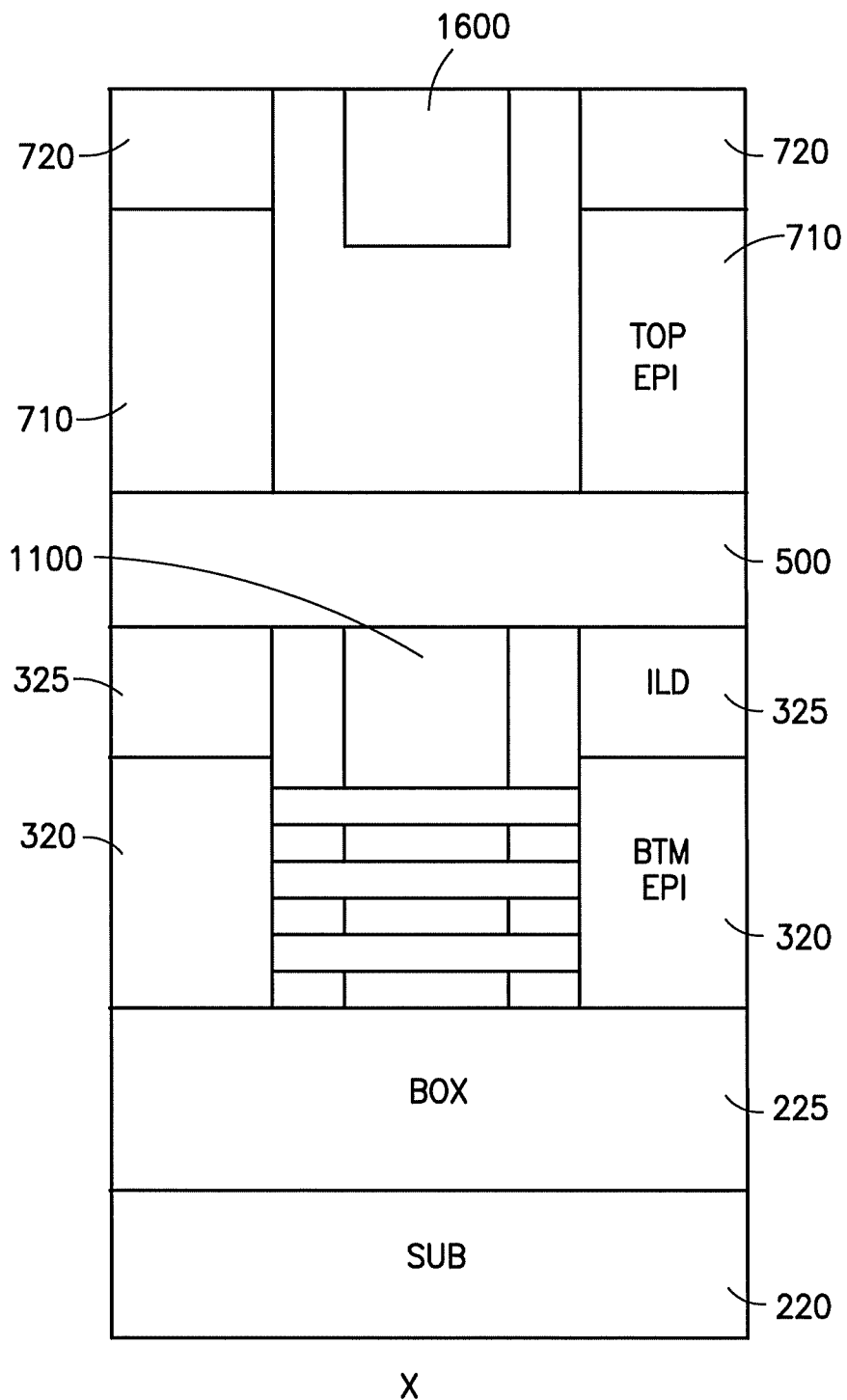
FIGS. 16A and 16B are schematic side views of metal deposited into the space of the dummy gate pulled from the top layer to form multi-Vt devices.
Figure 16B:
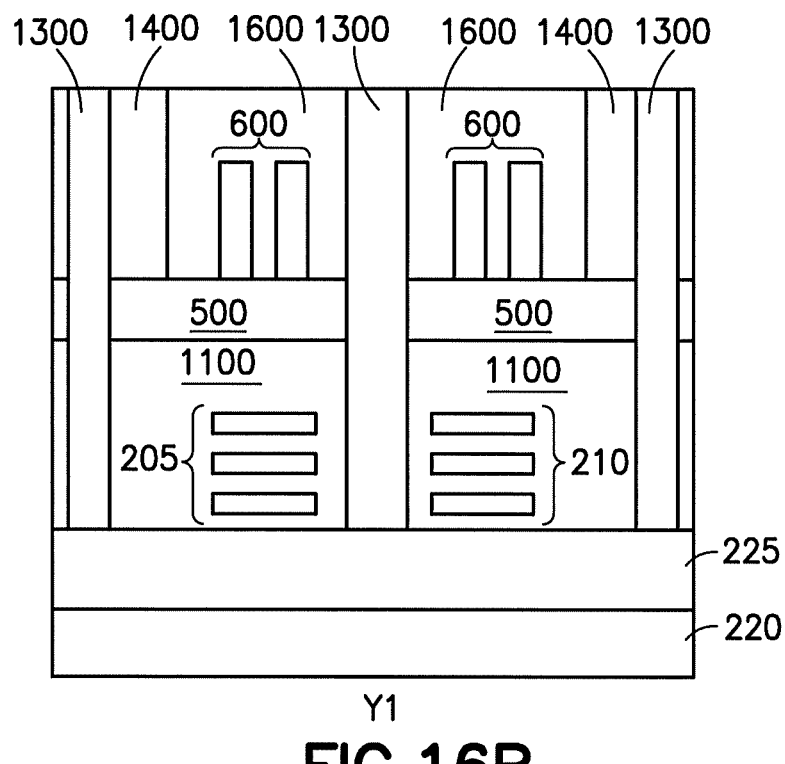

As shown in FIGS. 16A and 16B, the void formed upon removal of the polysilicon of the upper dummy gate 730 in the top layer 505 is filled with a top gate material 1600, thereby forming a multi-Vt device.

As shown in FIGS. 17A, 17B, and 17C, additional dielectric is deposited on layer 720 to form a middle-of-line (MOL) ILD layer 1750, and first contacts CA1 and CA2 are formed through the MOL ILD layer 1750 to the material of the regions 710, and second contacts CB2 are also formed through the MOL ILD layer 1750 and the entire top layer 505 to the bonding oxide layer 500 (the isolation insulator layer). Additionally, a third contact CA2 is also formed through the top layer 505 to the layer 320. A dielectric cap 1700 may be deposited on the third contact CA2. A chemical mechanical polish (CMP) may then be carried out to planarize the contacts with the MOL ILD layer 1750.

As shown in FIGS. 18A, 18B, and 18C, a back-end-of-line (BEOL) layer 1800 is deposited on the top layer 505, and a carrier wafer 1810 is bonded to the BEOL layer 1800. The structure is then flipped over, and a backside power distribution network 1900 (BSPDN 1900) is deposited on a bottom surface of the substrate 220 to result in the semiconductor device 100 as shown in FIG. 1.

In another exemplary embodiment, the method of fabrication may be adjusted accordingly to result in the semiconductor device 2000 as shown in FIGS. 19A, 19B, and 19C. In the semiconductor device 2000, the finned FET devices 600 are replaced with additional FETs 2010 having non-dipole devices and/or dipole elements fabricated in accordance with the methods as described above.

In another exemplary embodiment, a method is the same up through forming the space upon removal of the polysilicon of the upper dummy gate 730 in the top layer 505. The space is filled with a top gate material 1600, thereby forming a multi-Vt device, as shown in FIGS. 16A, 16B, and 16C above. However, as shown in FIGS. 20A, 20B, and 20C, the contact formation may result in a different arrangement of contacts as compared to previous embodiments. In particular, first contacts CA1 and CA2 are formed through the MOL ILD layer 1750 to the material of the regions 710, second contacts CB2 and CB3 are also formed through the MOL ILD layer 1750 and the entire top layer 505 to the bottom gate 215, and a third contact CA2 is also formed through the top layer 505 to the layer 320. A fourth contact CB1 is then formed through the MOL ILD layer 1750 and to the top gate material 1600. A dielectric cap 1700 may be deposited on the third contact CA2. A CMP is then carried out on the upper surface to planarize the contacts with the MOL ILD layer 1750.

Then, as shown in FIGS. 21A, 21B, and 21C, similar to FIGS. 18A, 18B, and 18C, a back-end-of-line (BEOL) layer 1800 is deposited on the top layer 505, and a carrier wafer 1810 is bonded to the BEOL layer 1800. The structure is then flipped over, and a backside power distribution network 1900 (BSPDN 1900) is deposited on a bottom surface of the substrate 220 to result in a semiconductor device 2200 as shown in FIGS. 22A, 22B, and 22C.

One exemplary method of fabrication of a semiconductor device is shown at 2300 in FIG. 23. At block 2305, a bottom channel for a FET is formed on a BOX layer on a substrate. As indicated above, the substrate may be silicon. The bottom channel may be alternating layers of Si and SiGe. At block 2310, a bottom dummy gate is formed around the structure of the bottom channel. At block 2315, the material of the bottom dummy gate is removed, and IL and high-k dielectric layers are deposited. Patterning may be carried out to form a dipole element on the structure of the bottom channel as shown at 2320, and any bottom transistor contacts may be formed as indicated at 2325. As indicated at block 2330, a top channel structure may be bonded over the bottom channel. As indicated at block 2335, a top dummy gate may be formed around the top channel structure, followed by removal of the bottom dummy gate and formation of IL and high-k dielectric layers, as indicated at block 2340. Spacer deposition such as TiN/rel poly deposition and planarization may be carried out, as indicated at block 2345. A CT cut may be formed to pull material of the bottom dummy gate, as shown at block 2350, followed by filling of the resulting void to form a bottom replacement metal gate (RMG) at 2355. As indicated at block 2360, the top dummy gate is removed, and a top RMG is formed with multi-Vt patterning. Contacts are formed, as in block 2365. The structure may then be flipped, and a BSPDN may be formed on a surface, as indicated at block 2370.

The above-described exemplary embodiments exhibit various high-value attributes. For example, the thermal budget of the topmost transistor or device is such that degradation of the gate stack is minimized due to the 3D aspect of the overall semiconductor package. This provides an advantage over the prior art in that the concerns of gate stack thermal budgeting in stacked FETs is addressed. Furthermore, the semiconductor package has the ability to provide multiple threshold voltages (e.g., metal gate patterning and dipole patterning) in a unitary structure, thus increasing overall efficiency. Moreover, the embodiments described herein illustrate the ability to provide both shared gates and independent gates in a single structure.

In one aspect, a semiconductor device comprises: a substrate; a set of first transistors positioned on an upper surface of the substrate, each of the set of first transistors comprising a first gate and a first dielectric; an insulating layer positioned on an upper surface of the set of first transistors; and a set of second transistors positioned over the set of first transistors and with the set of first transistors on an upper surface of the insulating layer, each of the set of second transistors having a second gate and a second dielectric. Each of the first dielectrics is connected to a sidewall of each of a corresponding first gate. Each of the second dielectrics is connected to the insulating layer.

At least one of the transistors of the set of first transistors may comprise a dipole element and at least one of the transistors of the set of first transistors may comprise a non-dipole element. At least one transistor of the set of second transistors may be positioned over at least one transistor of the set of first transistors in a stacked configuration and may define a multiple threshold voltage arrangement. The semiconductor device may further comprise a self-aligned gate connection between at least one of the transistors of the set of first transistors and at least one of the transistors of the second set of transistors. The semiconductor device may further comprise a back-end-of-line layer on an upper surface of the set of second transistors. The semiconductor device may further comprise a backside power distribution network on a lower surface of the substrate.

In another aspect, a method for forming a semiconductor device comprises: forming layers of silicon structure to form a first channel and a second channel on a substrate; processing the first channel to form a dipole element and the second channel to form a non-dipole element; depositing a first high-k dielectric layer around the first channel and the second channel and depositing a first interlayer dielectric on the first high-k dielectric layer; forming a bottom dummy gate around the dipole element and around the non-dipole element; bonding an insulation layer to the bottom dummy gate and a layer of silicon on the insulation layer; forming a first transistor element in the layer of silicon over the dipole element and a second transistor element in the layer of silicon over the non-dipole element; depositing a second high-k dielectric layer around the first transistor element and the second transistor element and depositing a second interlayer dielectric on the second high-k dielectric layer; forming an upper dummy gate around the first transistor element and the second transistor element; removing the first dummy gate to form a first void; filling the first void with a first metal to form a first replacement gate; removing the second dummy gate to form a second void; filling the second void with a second metal to form a second replacement gate; forming a first set of contacts to the first replacement gate and forming a second set of contacts to the second replacement gate; forming a back-end-of-line layer on the second set of contacts; and forming a backside power distribution network on the first set of contacts.

Forming layers of silicon structure to form a first channel and a second channel on a substrate may comprise depositing alternating layers of Si and SiGe and removing the SiGe. Forming the first transistor element and the second transistor element may comprise forming finned FET devices in the layer of silicon. Forming one of the first transistor element and the second transistor element may comprise forming a second dipole element. Removing the first dummy gate may comprise forming openings from the second interlayer dielectric to the first dummy gate and depositing spacers on one or more sidewalls of the openings. The method may further comprise pulling material of the first dummy gate through the formed openings. Filling the first void with the first metal to form the first replacement gate may comprise connecting the first metal to the insulation layer. The method may further comprise self-aligning the first replacement gate to the second replacement gate. The method may further comprise carrying out a chemical mechanical polish to planarize the contacts with the second interlayer dielectric.

In another aspect, a method for forming a semiconductor device comprises: forming a first transistor structure and a second transistor structure on a substrate; patterning the first transistor structure as a dipole element and configuring the second transistor structure as a non-dipole element; forming a first dummy gate over the dipole element and the non-dipole element; depositing an insulator layer on the first dummy gate; forming a third transistor structure over the dipole element and a fourth transistor structure over the non-dipole element; forming a second dummy gate over the third transistor structure and the fourth transistor structure; replacing the first dummy gate with a first replacement gate; replacing the second dummy gate with a second replacement gate to form a multiple threshold voltage formation between at least the first transistor structure and the third transistor structure; depositing an MOL interlayer dielectric layer over the second replacement gate; forming a first set of contacts from the MOL interlayer dielectric layer to one or more of the first replacement gate and the second replacement gate; forming a second set of contacts from the substrate to the first replacement gate; forming back-end-of-line layer on the first set of contacts; and forming a backside power distribution network on the second set of contacts.

Forming a third transistor structure and forming the fourth transistor structure may comprise forming a dipole element and a non-dipole element. The method may further comprise forming a first high-k dielectric layer and a first interlayer dielectric around the first dummy gate and forming a second high-k dielectric layer and a second interlayer dielectric around the second dummy gate. The method may further comprise forming a carrier wafer on the back-end-of-line layer.

In another aspect, a method for forming a semiconductor device comprises: forming a first transistor structure and a second transistor structure on a substrate; patterning the first transistor structure to form a dipole element and configuring the second transistor structure as a non-dipole element; forming a first dummy gate over the dipole element and the non-dipole element; depositing an insulator layer on the first dummy gate; forming a third transistor structure over the dipole element and a fourth transistor structure over the non-dipole element; forming a second dummy gate over the third transistor structure and the fourth transistor structure; replacing the first dummy gate with a first replacement gate; replacing the second dummy gate with a second replacement gate to form a multiple threshold voltage formation between at least the first transistor structure and the third transistor structure; depositing an MOL interlayer dielectric layer over the second replacement gate; forming a first set of contacts to one or more of the first replacement gate and the second replacement gate; forming a second set of contacts to the first replacement gate; forming back-end-of-line layer on the first set of contacts; and forming a backside power distribution network on the second set of contacts.

The first set of contacts may be formed from the MOL interlayer dielectric layer to one or more of the first replacement or the second replacement gate, and the second set of contacts may be formed from the substrate to the first replacement gate. Both the first set of contacts and the second set of contacts may be formed through the MOL interlayer dielectric layer. The first replacement gate and the second replacement gate may be self-aligned.

In another aspect, a method comprises: forming a first FET comprising a dipole element on a substrate; forming a second FET comprising a non-dipole element on a substrate; depositing a bottom dummy gate and a first dielectric layer around the dipole element and around the non-dipole element; bonding an insulating layer to the bottom dummy gate and a layer of silicon on the insulating layer; forming a third FET in the layer of silicon over the dipole element and a fourth FET in the layer of silicon over the non-dipole element; depositing an upper dummy gate and a second dielectric layer around the third FET and the fourth FET; replacing the first dummy gate with a first metal gate; replacing the second dummy gate with a second metal gate; forming a first set of contacts to the first metal gate and forming a second set of contacts to the second metal gate; forming a back-end-of-line layer on the second set of contacts; and forming a backside power distribution network on the first set of contact. The first dielectric layer is connected to a sidewall of the first metal gate. The second dielectric layer is connected to the insulating layer.

The first metal gate and the second metal gate may be self-aligned.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A method for forming a semiconductor device, the method comprising:
    forming layers of silicon structure to form a first channel and a second channel on a substrate;
    processing the first channel to form a dipole element and the second channel to form a non-dipole element;
    depositing a first high-k dielectric layer around the first channel and the second channel and depositing a first interlayer dielectric on the first high-k dielectric layer;
    forming a bottom dummy gate around the dipole element and around the non-dipole element;
    bonding an insulation layer to the bottom dummy gate and a layer of silicon on the insulation layer;
    forming a first transistor element in the layer of silicon over the dipole element and a second transistor element in the layer of silicon over the non-dipole element;
    depositing a second high-k dielectric layer around the first transistor element and the second transistor element and depositing a second interlayer dielectric on the second high-k dielectric layer;
    forming an upper dummy gate around the first transistor element and the second transistor element;
    removing the bottom dummy gate to form a first void;
    filling the first void with a first metal to form a first replacement gate;
    removing the upper dummy gate to form a second void;
    filling the second void with a second metal to form a second replacement gate;
    forming a first set of contacts to the first replacement gate and forming a second set of contacts to the second replacement gate;
    forming a back-end-of-line layer on the second set of contacts; and
    forming a backside power distribution network on the first set of contacts.

2. The method of claim 1, wherein forming layers of silicon structure to form a first channel and a second channel on a substrate comprises depositing alternating layers of Si and SiGe and removing the SiGe.

3. The method of claim 1, wherein forming the first transistor element and the second transistor element comprises forming finned FET devices in the layer of silicon.

4. The method of claim 1, wherein forming one of the first transistor element and the second transistor element comprises forming a second dipole element.

5. The method of claim 1, wherein removing the bottom dummy gate comprises forming openings from the second interlayer dielectric to the bottom dummy gate and depositing spacers on one or more sidewalls of the openings.

6. The method of claim 5, further comprising pulling material of the bottom dummy gate through the openings.

7. The method of claim 1, wherein filling the first void with the first metal to form the first replacement gate comprises connecting the first metal to the insulation layer.

8. The method of claim 1, further comprising self-aligning the first replacement gate to the second replacement gate.

9. The method of claim 1, further comprising carrying out a chemical mechanical polish to planarize the first set of contacts and the second set of contacts with the second interlayer dielectric.

10. A method for forming a semiconductor device, the method comprising:
    forming a first transistor structure and a second transistor structure on a substrate;
    patterning the first transistor structure as a dipole element and configuring the second transistor structure as a non-dipole element;
    forming a first dummy gate over the dipole element and the non-dipole element; depositing an insulator layer on the first dummy gate;
    forming a third transistor structure over the dipole element and a fourth transistor structure over the non-dipole element;
    forming a second dummy gate over the third transistor structure and the fourth transistor structure;
    replacing the first dummy gate with a first replacement gate;

replacing the second dummy gate with a second replacement gate to form a multiple threshold voltage formation between at least the first transistor structure and the third transistor structure;

depositing a middle of line (MOL) interlayer dielectric layer over the second replacement gate;

forming a first set of contacts from the MOL interlayer dielectric layer to one or more of the first replacement gate and the second replacement gate;

forming a second set of contacts from the substrate to the first replacement gate;

forming back-end-of-line layer on the first set of contacts; and forming a backside power distribution network on the second set of contacts.

11. The method of claim 10, wherein forming a third transistor structure and forming the fourth transistor structure comprises forming a dipole element and a non-dipole element.

12. The method of claim 10, further comprising forming a first high-k dielectric layer and a first interlayer dielectric around the first dummy gate and forming a second high-k dielectric layer and a second interlayer dielectric around the second dummy gate.

13. The method of claim 10, further comprising forming a carrier wafer on the back-end-of-line layer.

14. A method for forming a semiconductor device, the method comprising:

forming a first transistor structure and a second transistor structure on a substrate;

patterning the first transistor structure to form a dipole element and configuring the second transistor structure as a non-dipole element;

forming a first dummy gate over the dipole element and the non-dipole element;

depositing an insulator layer on the first dummy gate;

forming a third transistor structure over the dipole element and a fourth transistor structure over the non-dipole element;

forming a second dummy gate over the third transistor structure and the fourth transistor structure;

replacing the first dummy gate with a first replacement gate;

replacing the second dummy gate with a second replacement gate to form a multiple threshold voltage formation between at least the first transistor structure and the third transistor structure;

depositing a middle of line (MOL) interlayer dielectric layer over the second replacement gate;

forming a first set of contacts to one or more of the first replacement gate and the second replacement gate;

forming a second set of contacts to the first replacement gate;

forming back-end-of-line layer on the first set of contacts; and forming a backside power distribution network on the second set of contacts.

15. The method of claim 14, wherein the first set of contacts is formed from the MOL interlayer dielectric layer to one or more of the first replacement gate or the second replacement gate, and wherein the second set of contacts is formed from the substrate to the first replacement gate.

16. The method of claim 14, wherein both the first set of contacts and the second set of contacts is formed through the MOL interlayer dielectric layer.

17. The method of claim 14, wherein the first replacement gate and the second replacement gate are self-aligned.

18. A method, comprising:

forming a first FET comprising a dipole element on a substrate;

forming a second FET comprising a non-dipole element on a substrate;

depositing a bottom dummy gate and a first dielectric layer around the dipole element and around the non-dipole element;

bonding an insulating layer to the bottom dummy gate and a layer of silicon on the insulating layer;

forming a third FET in the layer of silicon over the dipole element and a fourth FET in the layer of silicon over the non dipole non-dipole element;

depositing an upper dummy gate and a second dielectric layer around the third FET and the fourth FET;

replacing the bottom dummy gate with a first metal gate;

replacing the upper dummy gate with a second metal gate;

forming a first set of contacts to the first metal gate and forming a second set of contacts to the second metal gate;

forming a back-end-of-line layer on the second set of contacts; and forming a backside power distribution network on the first set of contacts;

wherein the first dielectric layer is connected to a sidewall of the first metal gate; and wherein the second dielectric layer is connected to the insulating layer.

19. The method of claim 18, wherein the first metal gate and the second metal gate are self-aligned.

* * * * *